(12) United States Patent
Tsai et al.

(10) Patent No.: US 12,500,195 B2
(45) Date of Patent: Dec. 16, 2025

(54) CONNECTING STRUCTURE, PACKAGE STRUCTURE AND MANUFACTURING METHOD THEREOF

(71) Applicant: Taiwan Semiconductor Manufacturing Company, Ltd., Hsinchu (TW)

(72) Inventors: Tsung-Fu Tsai, Changhua County (TW); Jian-Yang He, Tainan (TW); Ying-Ching Shih, Hsinchu (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 262 days.

(21) Appl. No.: 17/232,094

(22) Filed: Apr. 15, 2021

(65) Prior Publication Data

US 2022/0336400 A1    Oct. 20, 2022

(51) Int. Cl.
*H01L 23/00*    (2006.01)
(52) U.S. Cl.
CPC .............. *H01L 24/16* (2013.01); *H01L 24/11* (2013.01); *H01L 24/13* (2013.01); *H01L 24/81* (2013.01); *H01L 2224/1147* (2013.01); *H01L 2224/13147* (2013.01); *H01L 2224/13583* (2013.01); *H01L 2224/13611* (2013.01); *H01L 2224/13647* (2013.01); *H01L 2224/13655* (2013.01); *H01L 2224/13657* (2013.01); *H01L 2224/16227* (2013.01); *H01L 2224/81801* (2013.01)

(58) Field of Classification Search
CPC ......... H01L 24/16; H01L 24/11; H01L 24/13; H01L 24/81; H01L 2224/1147; H01L 2224/13147; H01L 2224/13583; H01L 2224/13611; H01L 2224/13647; H01L 2224/13655; H01L 2224/13657; H01L 2224/16227; H01L 2224/81801
USPC .......................................................... 257/688
See application file for complete search history.

(56) References Cited

U.S. PATENT DOCUMENTS

2008/0264681 A1* 10/2008 Iwai .................. H01L 23/49816
                                                               228/208
2009/0085216 A1*  4/2009 Tanaka ................. B23K 35/264
                                                               257/772

(Continued)

FOREIGN PATENT DOCUMENTS

WO    WO-2009020180 A1 *  2/2009 ............. C23C 18/31

*Primary Examiner* — Norman D Richards
*Assistant Examiner* — Laura M Dykes
(74) *Attorney, Agent, or Firm* — JCIPRNET

(57) ABSTRACT

A structure including a substrate having a conductive pad and a connecting structure disposed on the conductive pad and electrically connected to the conductive pad. The connecting structure includes a first metallic layer disposed on the conductive pad, a first intermetallic compound layer disposed on the first metallic layer, a second intermetallic compound layer disposed on the first intermetallic compound layer and a second metallic layer disposed on the second intermetallic compound layer. The first metallic layer comprises copper. The first intermetallic compound layer comprises a first intermetallic compound. The second intermetallic compound layer comprises a second intermetallic compound different from the first intermetallic compound. The second metallic layer comprises tin. The first intermetallic compound contains copper, tin and one of nickel and cobalt.

20 Claims, 20 Drawing Sheets

(56) References Cited

U.S. PATENT DOCUMENTS

| | | | |
|---|---|---|---|
| 2011/0193227 A1* | 8/2011 | Chuang | H01L 24/16 |
| | | | 257/E23.129 |
| 2012/0007239 A1* | 1/2012 | Kolics | H01L 24/04 |
| | | | 257/E21.59 |
| 2012/0091576 A1* | 4/2012 | Tsai | H01L 24/03 |
| | | | 257/E21.59 |
| 2015/0184446 A1* | 7/2015 | Veerasamy | E06B 3/6612 |
| | | | 428/34 |
| 2016/0163668 A1* | 6/2016 | Hine | H01L 24/14 |
| | | | 174/257 |
| 2016/0260677 A1* | 9/2016 | Hsiao | H01L 25/0657 |

* cited by examiner

CONNECTING STRUCTURE, PACKAGE STRUCTURE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1A:
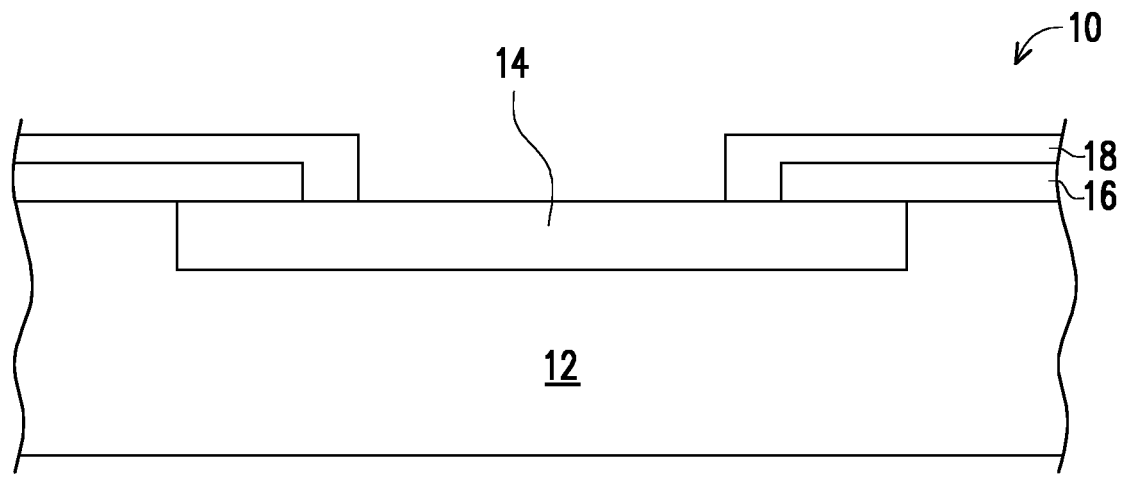
FIG. 1A through FIG. 1G are cross-sectional views schematically illustrating a process flow for fabricating a connecting structure of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A through FIG. 1G are cross-sectional views schematically illustrating a process flow for fabricating a connecting structure of a semiconductor structure in accordance with some embodiments of the present disclosure.

Referring to FIG. 1A, a structure 10 having a substrate 12 and at least a conductive pad 14 is provided. Although only one conductive pad is shown in FIG. 1A, it is understood that more than one conductive pad(s) may be included in the structure 10. In some embodiments, the structure 10 includes a semiconductor die, and the substrate 12 may be a semiconductor substrate made of an elemental semiconductor such as silicon, diamond or germanium, a compound semiconductor such as gallium arsenide, silicon carbide, indium arsenide, or indium phosphide or an alloy semiconductor, such as silicon germanium carbide, gallium arsenic phosphide, or gallium indium phosphide. In some embodiments, the substrate 12 includes a semiconductor-on-insulator (SOI) substrate such as silicon-on-insulator, germanium-on-insulator (GOI), silicon germanium on insulator (SGOI), or a combination thereof. For example, the semiconductor die includes integrated circuits and devices, such as transistors, capacitors, resistors, diodes, and the like, formed in the substrate 12 and/or formed on the substrate surface.

In some other embodiments, the structure 10 may be an interposer made of a semiconductor material (such as a bulk silicon wafer), and conductive vias (not shown) and/or redistribution layers (not shown) may be formed in the bulk of the interposer. In alternative embodiments, the structure 10 may include an organic interposer having an insulating core such as a fiberglass reinforced resin core and organic build up films. In some embodiments, the structure 10 includes passivation layers 16 and 18 sequentially formed over the substrate 12, covering the substrate 12 and the conductive pad 14 and partially revealing the conductive pad 14. For example, the materials of the passivation layers 16, 18 may include silicon oxide, silicon nitride, benzocyclobutene (BCB) polymer, polyimide (PI), polybenzoxazole (PBO) or a combination thereof, and the passivation layers 16, 18 may be formed by spin coating, CVD or the like. In some embodiments, the conductive pad 14 may be a metallic pad made of a metal, a metal alloy or a combination thereof, and the material of the metallic pad includes aluminum (Al), copper (Cu), tungsten (W), nickel (Ni), cobalt (Co), titanium (Ti) or alloys thereof.

Figure 1B:
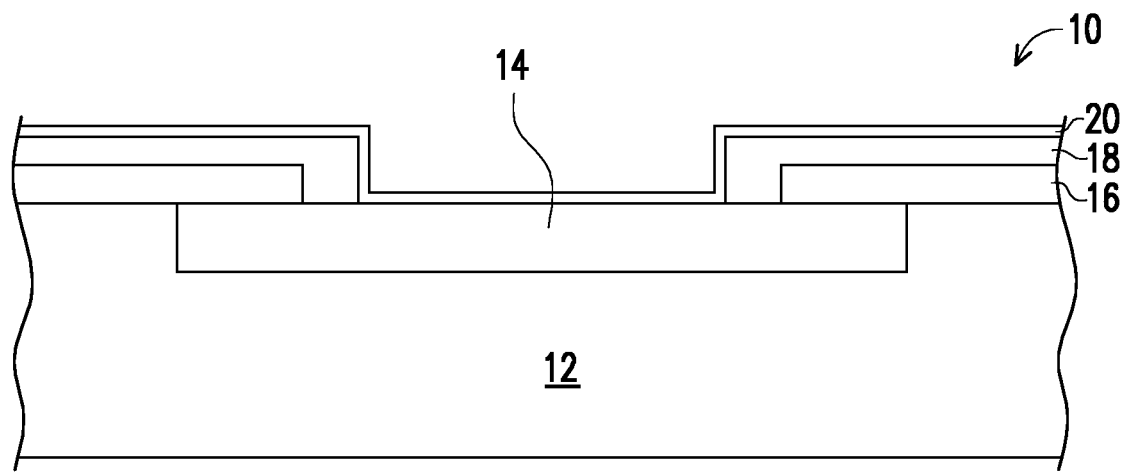

Referring to FIG. 1B, a seed layer 20 is formed over the substrate 12 and the passivation layer 18 and covering the revealed portion of the conductive pad 14. In some embodiments, the seed layer 20 includes a metallic seed layer including a copper layer, a titanium layer, or a Ti/Cu composite layer formed through a sputtering process.

Figure 1C:
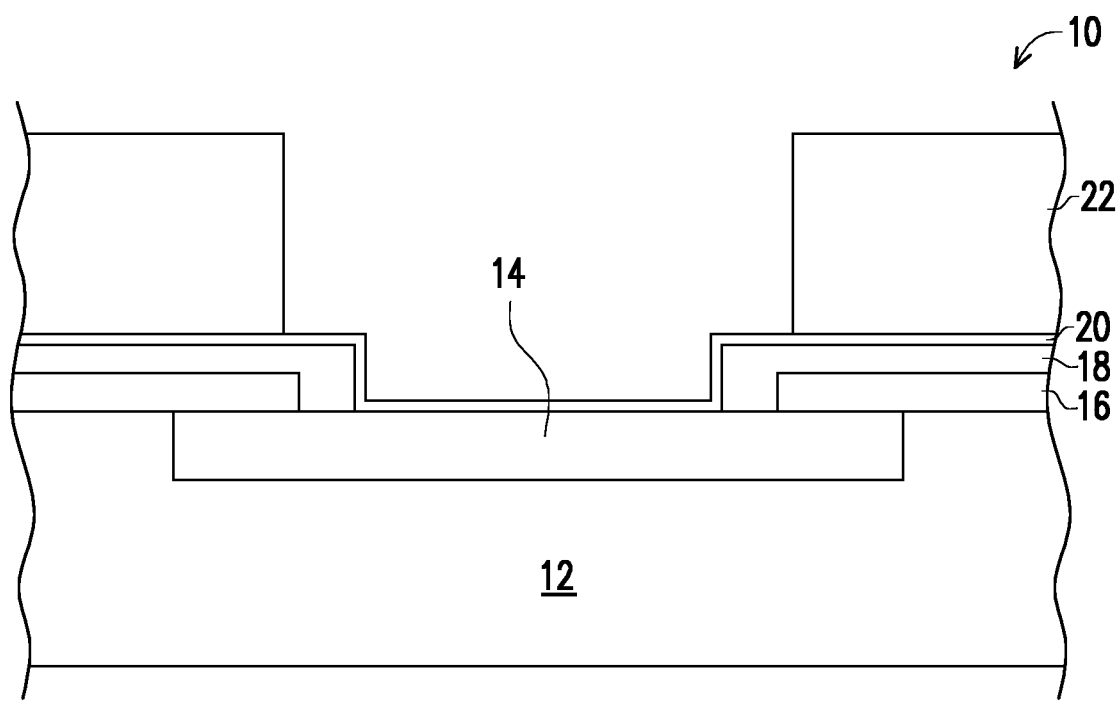

Referring to FIG. 1C, a patterned photoresist layer 22 is formed on the seed layer 20 with at least an opening 22a revealing the underlying seed layer 20. The location of the opening 22a corresponds to the conductive pad 14, and the opening 22a may reveal the whole conductive pad 14 or reveal the conductive pad 14 partially. It is understood that the number and the location of the opening(s) may be changed based on the number and the location of the conductive pad(s). The patterned photoresist layer 22 may be formed through a spin coating process followed by a photolithography process such that a predetermined pattern can be transferred onto the patterned photoresist layer 22.

Figure 1D:
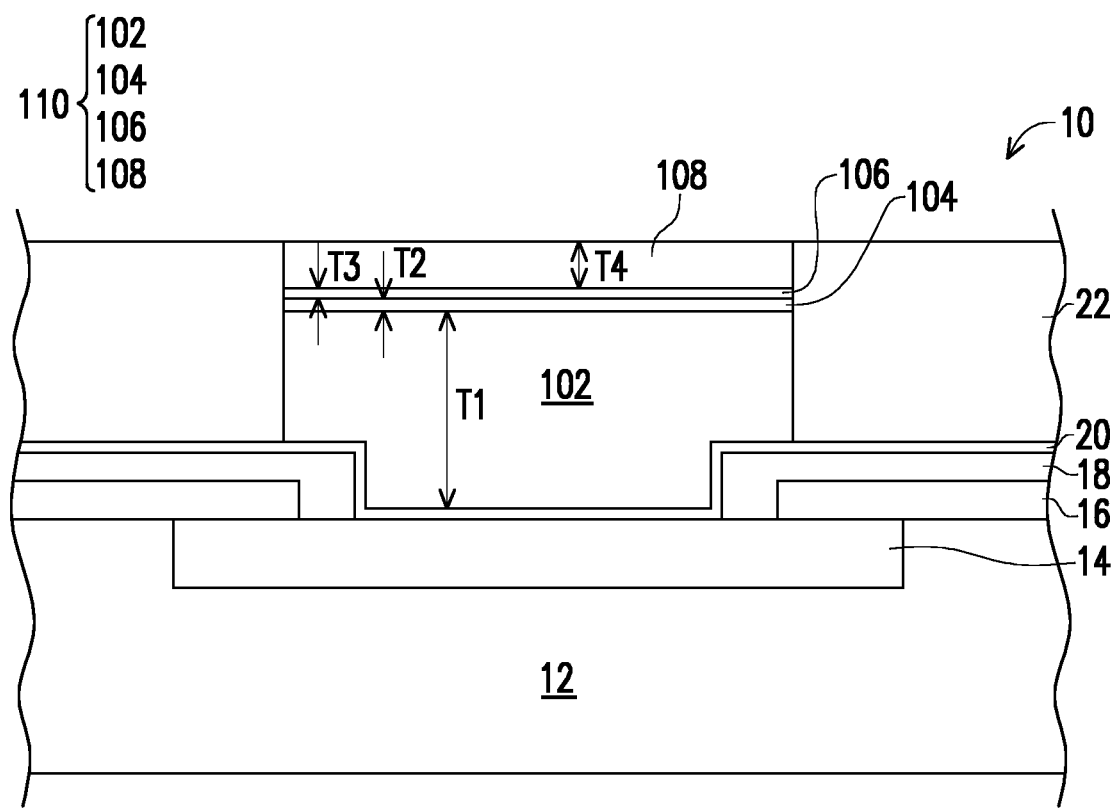

Referring to FIG. 1D, a first metal layer 102, a second metal layer 104, a third metal layer 106 and a fourth metal layer 108 are sequentially formed on the seed layer 20 within the opening 22a to form a block 110. Depending on the shape of the opening 22a, the block 110 may be a round or oval block. For example, through performing one or more plating processes, the first metal layer 102 is formed on the seed layer 20, the second metal layer 104 is then formed on the first metal layer 102, the third metal layer 106 is later formed on the second metal layer 104 and the fourth metal layer 108 is formed on the third metal layer 106. Plating process may be an electroplating process or an electroless plating process. In some embodiments, the first metal layer 102, the second metal layer 104, the third metal layer 106 and the fourth metal layer 108 are formed through different electroplating processes. In some embodiments, the material of the first metal layer 102 comprises copper or copper alloys. In some embodiments, the material of the second metal layer 104 comprises tin, tin alloys, silver, tin silver alloys or lead-free solder materials such as SnCu, SnCuAg, SnAgCuMn, SnAgCuZn or the combinations thereof. In some embodiments, the material of the third metal layer 106 comprises nickel, cobalt or alloys thereof. In some embodiments, the third metal layer 106 comprises nickel or nickel alloys. In some embodiments, the material of the fourth metal layer 108 comprises tin, tin alloys, silver, tin silver alloys or lead-free solder materials such as SnCu, SnCuAg, SnAgCuMn, SnAgCuZn or the combinations thereof. In one embodiment, the material of the fourth metal layer 108 is different from that of the second metal layer 104. In one embodiment, the material of the fourth metal layer 108 is substantially the same as that of the second metal layer 104.

In some embodiments, referring to FIG. 1D, a thickness T1 of the first metal layer 102 is larger than a sum of a thickness T2 of the second metal layer 104 and a thickness T4 of the fourth metal layer 108. In some embodiments, the ratio of the thickness T2 of the second metal layer 104 to a thickness T3 of the third metal layer 106 is about 1-20. In some embodiments, a thickness T4 of the fourth metal layer 108 is larger than the thickness T3 of the third metal layer 106. In some embodiments, the thickness T4 of the fourth metal layer 108 is larger than the thickness T2 of the second metal layer 104. In some embodiments, the thickness T2 of the second metal layer 104 ranges from about 0.1 microns to about 5 microns. In some embodiments, the thickness T2 of the second metal layer 104 may be greater than 0.5 microns. In some embodiments, the thickness T2 of the second metal layer 104 ranges from about 1 microns to about 4 microns. In some embodiments, the thickness T3 of the third metal layer 106 ranges from about 0.1 microns to about 2 microns. In some embodiments, the thickness T3 of the third metal layer 106 ranges from about 0.1 microns to about 1 micron. In some embodiments, the thickness T3 of the third metal layer 106 ranges from about 0.1 microns to about 0.5 microns. In some embodiments, the thickness T3 of the third metal layer 106 ranges from about 0.5 microns to about 2 microns. In some embodiments, the thickness T3 of the third metal layer 106 ranges from about 0.5 microns to about 1.5 microns. In some embodiments, the thickness T4 of the fourth metal layer 108 may be greater than 2 microns. In some embodiments, the thickness T4 of the fourth metal layer 108 is about 6 microns or greater than 6 microns. For example, the fourth metal layer 108 should be thick enough to provide enough solder volume for achieving reliable bonding with another connecting or bonding structure.

Figure 1E:
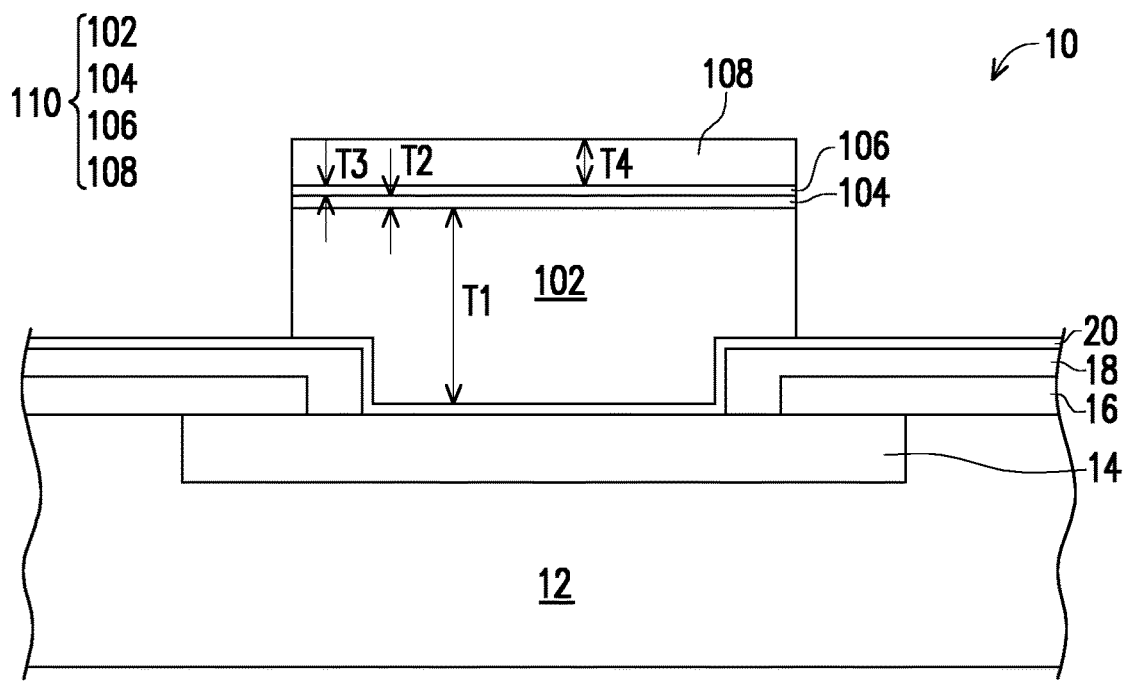

Referring to FIG. 1E, the patterned photoresist layer 22 is removed to reveal the underlying seed layer 20 through a removal process. The removal process may include a stripping process, an ash process, an etch process, a combination thereof, or other applicable removal processes. After removing the patterned photoresist layer 22, referring to FIG. 1F, the seed layer 20 outside the block 110 is removed and a seed pattern 20a is remained under the block 110. In some embodiments, the seed layer 20 is partially removed through performing an etching process by using the block 110 as a mask.

Figure 1F:
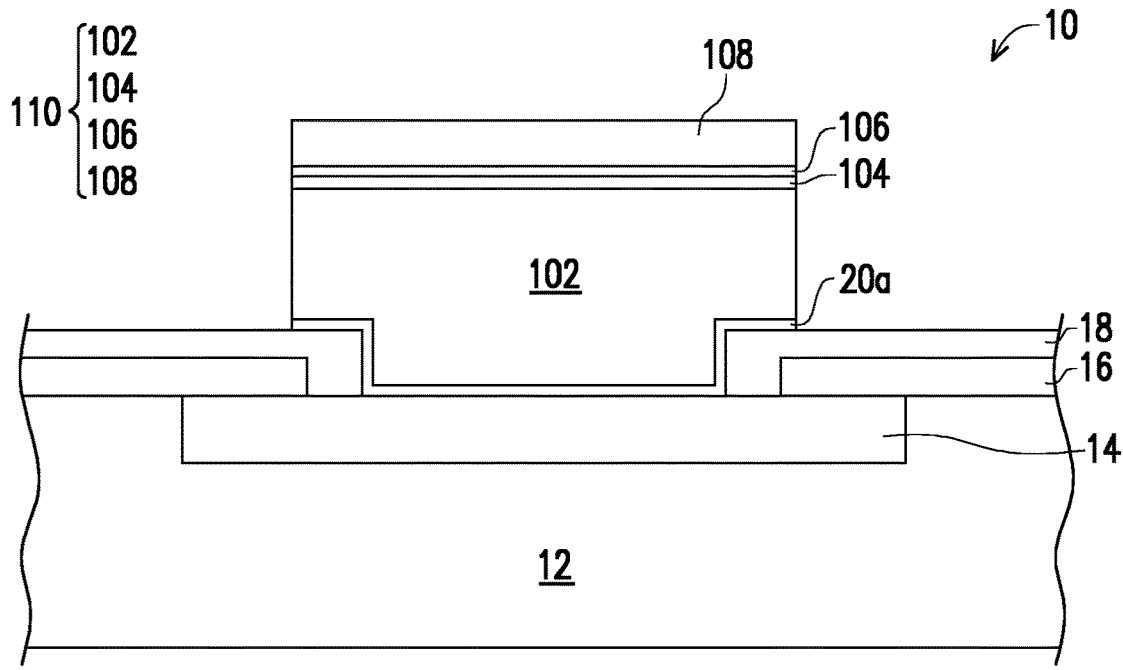
Figure 1G:
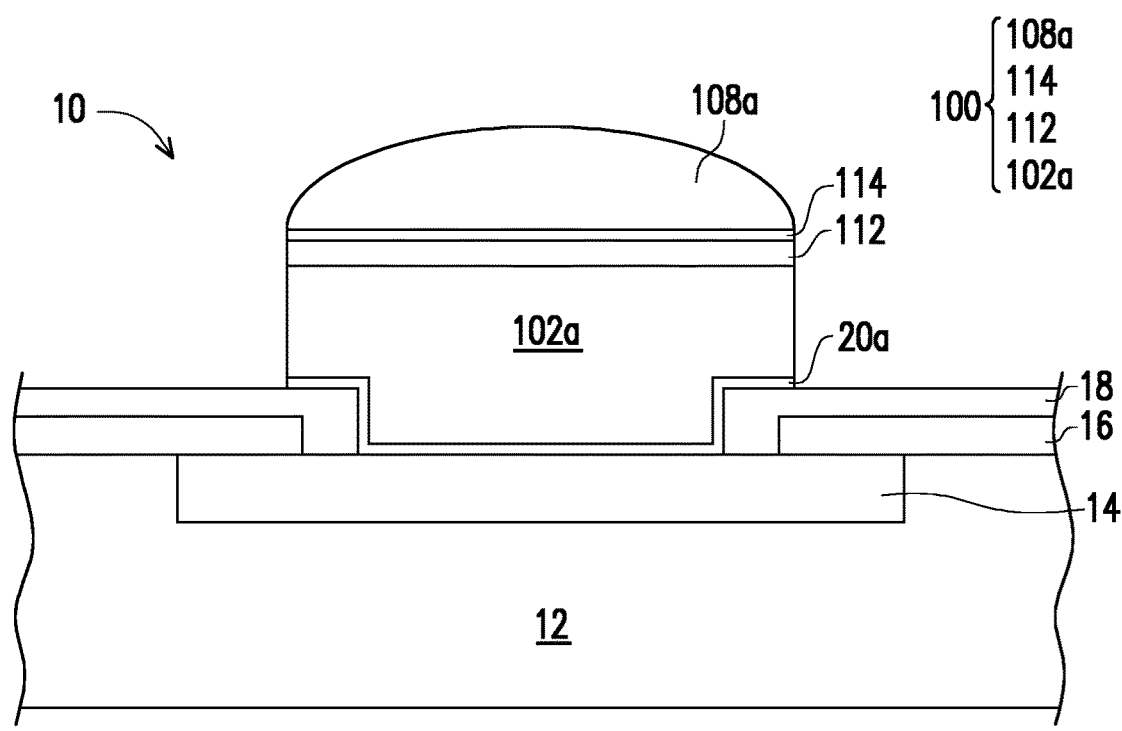

Referring to FIG. 1G, a thermal process is performed, and a connecting structure 100 is formed. In some embodiments, the thermal process includes a reflow process. In some embodiments, the reflow process performed to the block 110 will turn the block 110 into a connecting structure 100 with a dome shaped top. For example, the reflow process is performed at a temperature above the melting point of the metallic or solder materials of the metal layers. In some embodiments, the reflow process is performed under the temperature range of about 230° C. to about 265° C., with a treatment time of 30 seconds to 90 seconds. During the thermal process, the metal layers of the block 110 interact with the adjacent metal layers, and intermetallic compound layers are formed. Referring to FIGS. 1F and 1G, in some embodiments, after the thermal process, the first metal layer 102 is partially consumed and becomes the first metallic layer 102a, the fourth metal layer 108 is partially consumed and becomes the fourth metallic layer 108a, and a first intermetallic compound layer 112 and a second intermetallic compound layer 114 are formed between the first metallic layer 102a and the fourth metallic layer 108a. The first intermetallic compound layer 112 that is adjacent to the first metallic layer 102a comprises a first intermetallic compound. In some embodiments, the first intermetallic compound includes a Cu—Ni—Sn intermetallic compound, a Cu—Co—Sn intermetallic compound or a combination thereof. The second intermetallic compound layer 114 that is adjacent to the fourth metallic layer 108a comprises a second intermetallic compound different from the first intermetallic compound.

In some embodiments, when the third metal layer 106 comprises nickel and the thickness T3 of the third metal layer 106 is in a range of about 0.1-0.5 microns, the first intermetallic compound layer 112 and the second intermetallic compound layer 114 include different Cu—Ni—Sn intermetallic compounds. In some embodiments, when the third metal layer 106 comprises cobalt and the thickness T3 of the third metal layer 106 is in a range of about 0.1-0.5 microns, the first intermetallic compound layer 112 and the second intermetallic compound layer 114 include different Cu—Co—Sn intermetallic compounds. In some embodiments, after the thermal process, for the connecting structure 100, a thickness of the first metallic layer 102a is about 30~50% of a total height of the connecting structure 100, while a thickness of the fourth metallic layer 108a is about 20~50% of the total height of the connecting structure 100. In some embodiments, a thickness of the first metallic layer 102a ranges from about 3 microns to about 10 microns. In some embodiments, the fourth metallic layer 108a is reflowed to have a dome-shaped top and has a maximum thickness of about 2 microns or larger. In some embodiments, the maximum thickness of the fourth metallic layer 108a ranges from about 6 microns to about 10 microns.

Referring to FIG. 1G again, the connecting structure 100 includes the first metallic layer 102a, the first intermetallic compound layer 112, the second intermetallic compound layer 114 and the fourth metallic layer 108a, from the bottom to the top. In some embodiments, the first metallic layer 102a comprises copper, the fourth metallic layer 108a comprises tin, and the first and second intermetallic compound layers 112 and 114 comprise Cu—Ni—Sn intermetallic compounds. In some embodiments, the Cu—Ni—Sn intermetallic compound included in the second intermetallic compound layer 114 is different from the Cu—Ni—Sn intermetallic compound included in the first intermetallic compound layer 112. In some embodiments, the Cu—Ni—Sn intermetallic compound included in the second intermetallic compound layer 114 has a nickel content higher than the nickel content of the Cu—Ni—Sn intermetallic compound included in the first intermetallic compound layer 112. In some embodiments, the Cu—Ni—Sn intermetallic compound included in the first intermetallic compound layer 112 may be represented by $(Cu_xNi_y)_6Sn_5$ (0.2<x<1, and 0<y<0.8), and the Cu—Ni—Sn intermetallic compound included in the second intermetallic compound layer 114 may be represented by $(Cu_zNi_w)_3Sn_4$ (0<z<0.4, and 0.6<w<1). In one embodiment, the Cu—Ni—Sn intermetallic compound included in the first intermetallic compound layer 112 that is represented by $(Cu_xNi_y)_6Sn_5$ has a nickel content of about 20 wt %.

In some embodiments, due to the existence of the third metal layer, a stable ternary intermetallic compound is formed between the first and fourth metal layers. For example, compared with the stacked structure of a copper pillar and a solder material, when a nickel layer is inserted into the solder material layer (i.e. part of the solder material is located between the copper pillar and the nickel layer), a sufficient amount of solder material is maintained above the nickel layer and a stable Cu—Ni—Sn intermetallic compound is formed between the copper pillar and the nickel layer after the thermal process, so that solder collapse may be reduced. Furthermore, the presence of the stable Cu—Ni—Sn intermetallic compound also lessens copper consumption during high temperature storage test (HTST), and the intermetallic compound shrinkage voids and Kinkendall voids are reduced. In some embodiments, the connecting structure(s) described above provides good quality bonding with improved reliability.

Figure 2A:
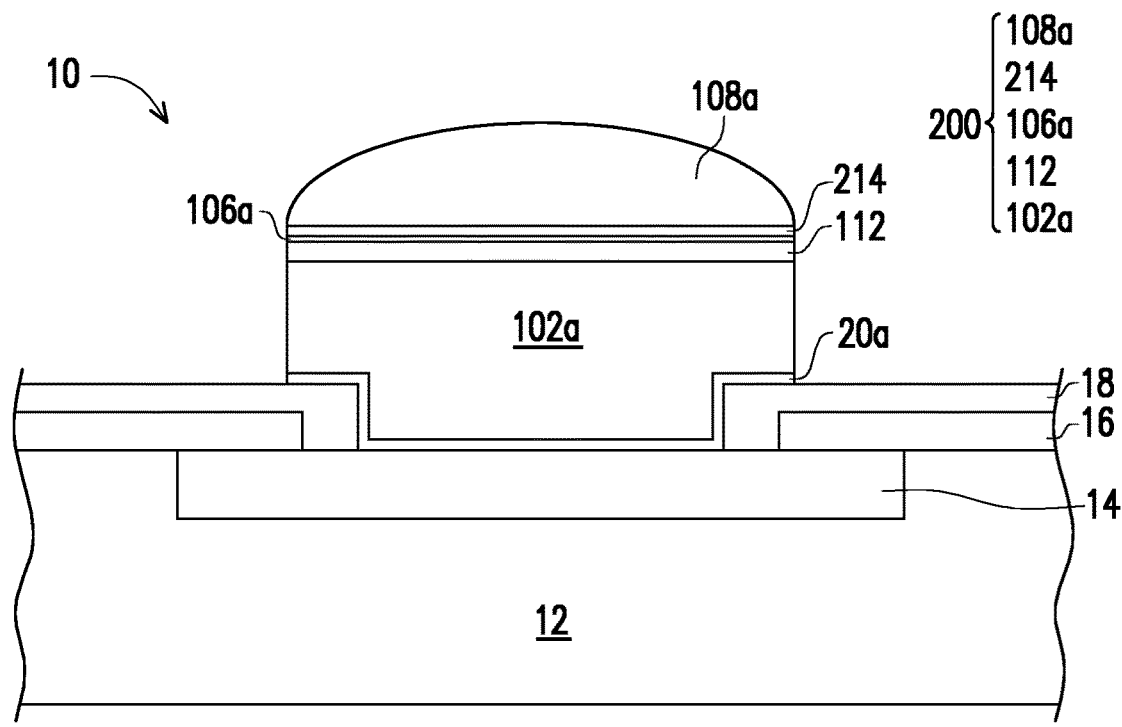
FIGS. 2A, 2B and 2C are schematic cross-sectional views illustrating various connecting structures in accordance with other embodiments of the present disclosure.
Figure 2B:
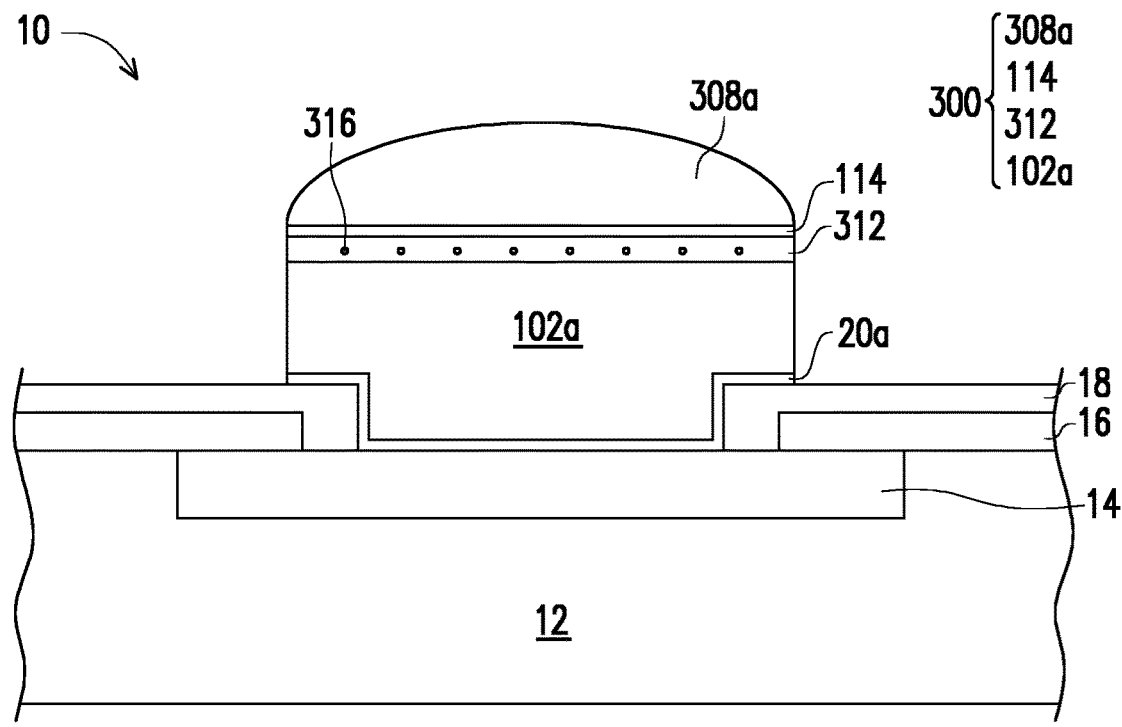
Figure 2C:
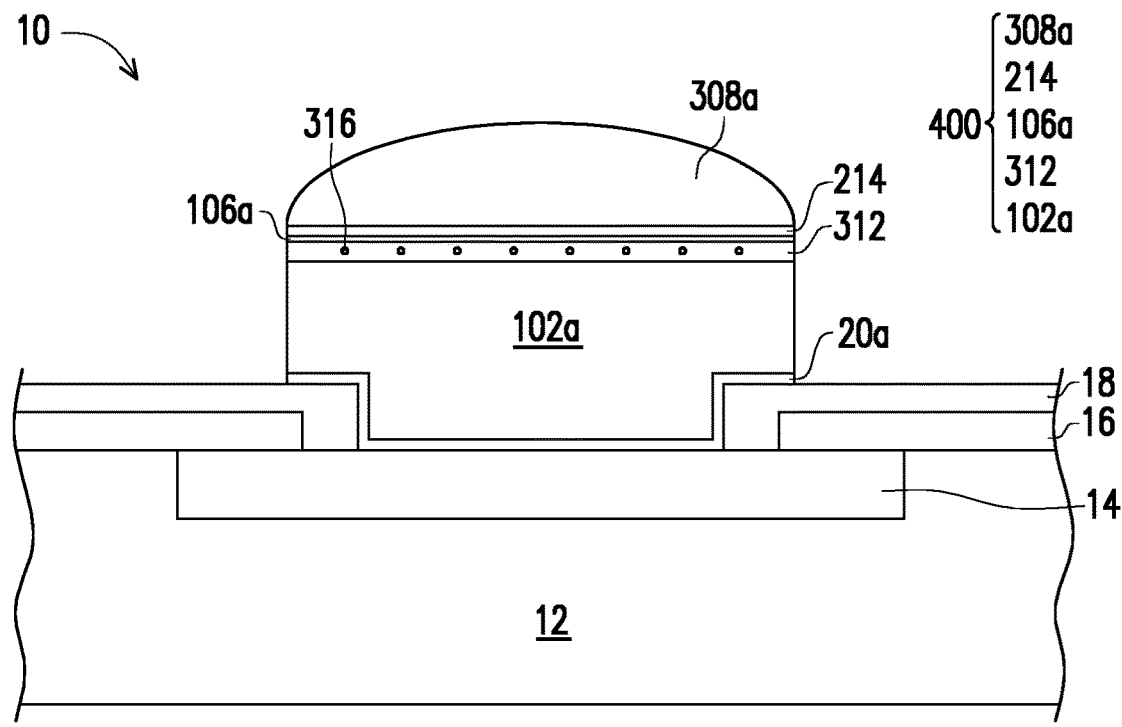

FIGS. 2A, 2B and 2C are schematic cross-sectional views illustrating various connecting structures in accordance with other embodiments of the present disclosure.

Referring to FIG. 2A, in alternative embodiments, when the thickness T3 of the third metal layer 106 is in a range of about 0.5-2 microns and the second metal layer and the fourth metal layer comprises tin or SnCu, after the thermal process, the third metal layer 106 is partially consumed and becomes the third metallic layer 106a, a second intermetallic compound layer 214 is formed between the third metallic layer 106a and the fourth metallic layer 108a, and a connecting structure 200 is formed. Herein, the connecting structure 200 may be similar to the above described connecting structure 100, and the same or similar parts or layers of the structures in various embodiments may be labelled with the same reference number(s) for easy illustration. In some embodiments, the connecting structure 200 includes the first metallic layer 102a, the first intermetallic compound layer 112, the third metallic layer 106a, the second intermetallic compound layer 214 and the fourth metallic layer 108a, from the bottom to the top. The third metallic layer 106a is disposed between the first intermetallic compound layer 112 and the second intermetallic compound layer 214. In some embodiments, the third metallic layer 106a comprises nickel, cobalt or alloys thereof, and the second intermetallic compound layer 214 includes a Ni—Sn intermetallic compound, a Co—Sn intermetallic compound or a combination thereof. In some embodiments, the third metallic layer 106a comprises nickel or nickel alloys, and the second intermetallic compound layer 214 includes a Ni—Sn intermetallic compound. In some embodiments, the Ni—Sn intermetallic compound included in the second intermetallic compound layer 214 has a nickel content higher than the nickel content of the Cu—Ni—Sn intermetallic compound included in the first intermetallic compound layer 112. In some embodiments, the Ni—Sn intermetallic compound included in the second intermetallic compound layer 214 may be represented by $Ni_3Sn_4$. In some embodiments, the connecting structure 200 includes the first metallic layer 102a containing copper, the first intermetallic compound layer 112 containing a Cu—Ni—Sn intermetallic compound, the third metallic layer 106a containing nickel, the second intermetallic compound layer 214 containing a Ni—Sn intermetallic compound and the fourth metallic layer 108a containing tin or SnCu.

Referring to FIG. 2B, in alternative embodiments, when the thickness T3 of the third metal layer 106 is in a range of about 0.1-0.5 microns and the second metal layer and the fourth metal layer comprises SnAg or SnAgCu, after the thermal process, a first intermetallic compound layer 312 with silver compound particles 316 dispersed in the first intermetallic compound layer 312 is formed between the first metallic layer 102a and the second intermetallic compound layer 114, the fourth metal layer is partially consumed and becomes the fourth metallic layer 308a, and a connecting structure 300 is formed. Herein, the connecting structure 300 may be similar to the above described connecting structure 100, and the same or similar parts or layers of the structures in various embodiments may be labelled with the same reference number(s) for easy illustration. In some embodiments, the connecting structure 300 includes the first metallic layer 102a, the first intermetallic compound layer 312, the second intermetallic compound layer 114, the fourth metallic layer 308a, from the bottom to the top, and silver compound particles 316 dispersed in the first intermetallic compound layer 312. In some embodiments, the silver compound particles 316 comprises an Ag—Sn compound. In some embodiments, the Ag—Sn compound may be represented by $Ag_3Sn$. In some embodiments, the particle size of the silver compound particles 316 is in a range of about 30 nm to about 2000 nm. In some embodiments, the content of the silver compound particles 316 in the first intermetallic compound layer 312 is in a range of about 1.5 wt % to about 4.5 wt % In some embodiments, the connecting structure 300 includes the first metallic layer 102a containing copper, the first intermetallic compound layer 312 containing a Cu—Ni—Sn intermetallic compound with the silver compound particles 316 containing $Ag_3Sn$ dispersed in the first intermetallic compound layer 312, the second intermetallic compound layer 114 containing a Cu—Ni—Sn intermetallic compound different from the Cu—Ni—Sn intermetallic compound contained in the first intermetallic compound layer 312 and the fourth metallic layer 308a containing SnAg or SnAgCu.

Referring to FIG. 2C, in alternative embodiments, when the thickness T3 of the third metal layer 106 is in a range of about 0.5-2 microns and the second metal layer and the fourth metal layer comprises SnAg or SnAgCu, after the thermal process, the third metal layer 106 is partially consumed and becomes the third metallic layer 106a, a first intermetallic compound layer 312 with silver compound particles 316 dispersed in the first intermetallic compound layer 312 is formed between the first metallic layer 102a and the third metallic layer 106a, the fourth metal layer is partially consumed and becomes the fourth metallic layer 308a, a second intermetallic compound layer 214 is formed between the third metallic layer 106a and the fourth metallic layer 308a, and a connecting structure 400 is formed. Herein, the connecting structure 400 may be similar to the above described connecting structure 200, and the same or similar parts or layers of the structures in various embodiments may be labelled with the same reference number(s) for easy illustration. In some embodiments, the connecting structure 400 includes the first metallic layer 102a, the first intermetallic compound layer 312, the third metallic layer 106a, the second intermetallic compound layer 214, the fourth metallic layer 308a, from the bottom to the top, and silver compound particles 316 dispersed in the first intermetallic compound layer 312. The third metallic layer 106a is disposed between the first intermetallic compound layer 312 and the second intermetallic compound layer 214. In some embodiments, the third metallic layer 106a comprises nickel, cobalt or alloys thereof, and the second intermetallic compound layer 214 includes a Ni—Sn intermetallic compound, a Co—Sn intermetallic compound or a combination thereof. In some embodiments, the third metallic layer 106a comprises nickel or nickel alloys, and the second intermetallic compound layer 214 includes a Ni—Sn intermetallic compound. In some embodiments, the Ni—Sn intermetallic compound included in the second intermetallic compound layer 214 has a nickel content higher than the nickel content of the Cu—Ni—Sn intermetallic compound included in the first intermetallic compound layer 112. In some embodiments, the Ni—Sn intermetallic compound included in the second intermetallic compound layer 214 may be represented by $Ni_3Sn_4$. In some embodiments, the silver compound particles 316 comprises an Ag—Sn compound. In some embodiments, the Ag—Sn compound may be represented by $Ag_3Sn$. In some embodiments, the particle size of the silver compound particles 316 is in a range of about 30 nm to about 2000 nm. In some embodiments, the content of the silver compound particles 316 in the first intermetallic compound layer 312 is in a range of about 1.5 wt % to about 4.5 wt % In some embodiments, the connecting structure 400 includes the first metallic layer 102a containing copper, the first intermetallic compound layer 312 containing a Cu—Ni—Sn intermetallic compound with the silver compound particles 316 containing $Ag_3Sn$ dispersed in the first intermetallic compound layer 312, the third metallic layer 106a containing nickel, the second intermetallic compound layer 214 containing a Ni—Sn intermetallic compound and the fourth metallic layer 308a containing SnAg or SnAgCu.

Figure 3A:
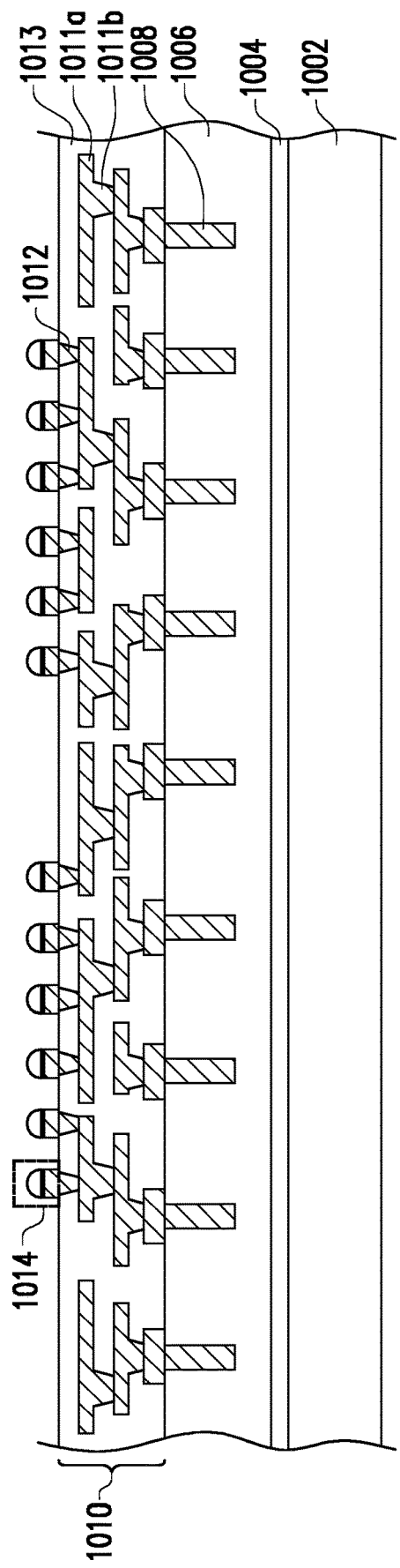
FIG. 3A through FIG. 3N are cross-sectional views schematically illustrating a process flow for fabricating a package structure in accordance with some embodiments of the present disclosure.
Figure 3B:
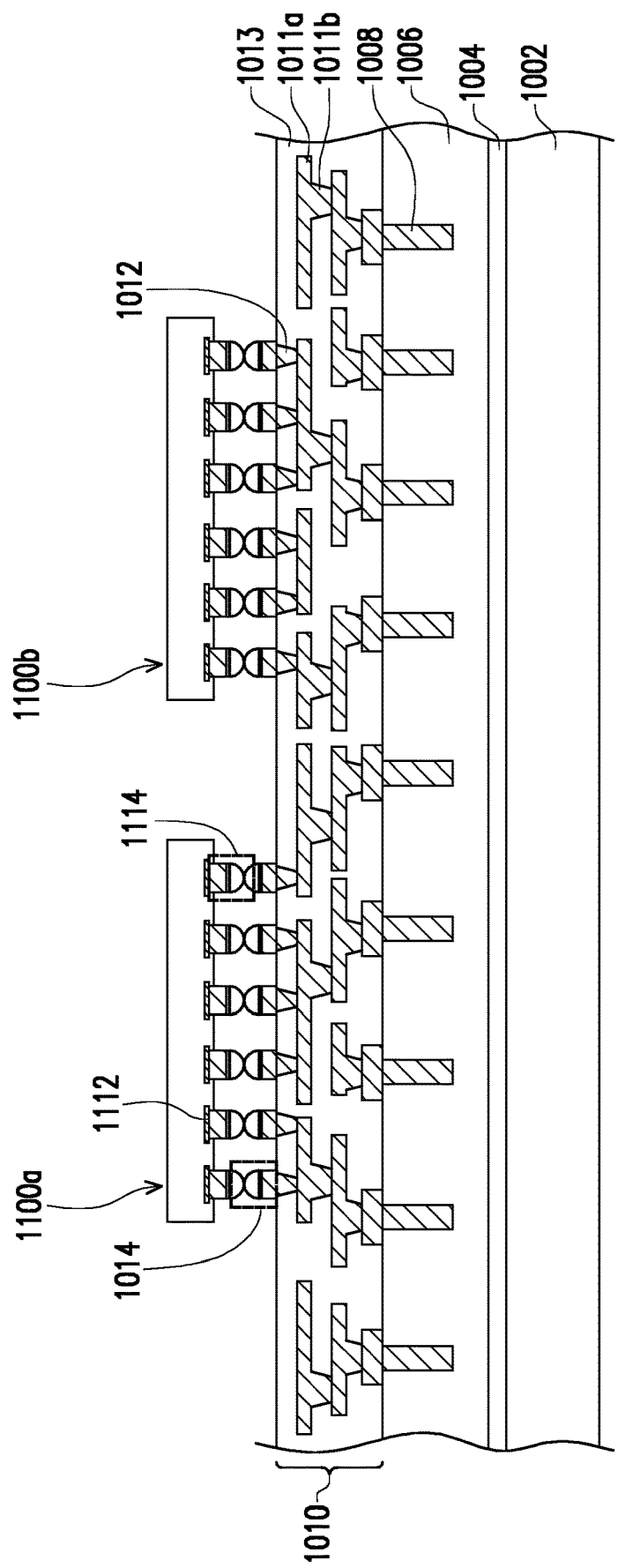
Figure 3C:
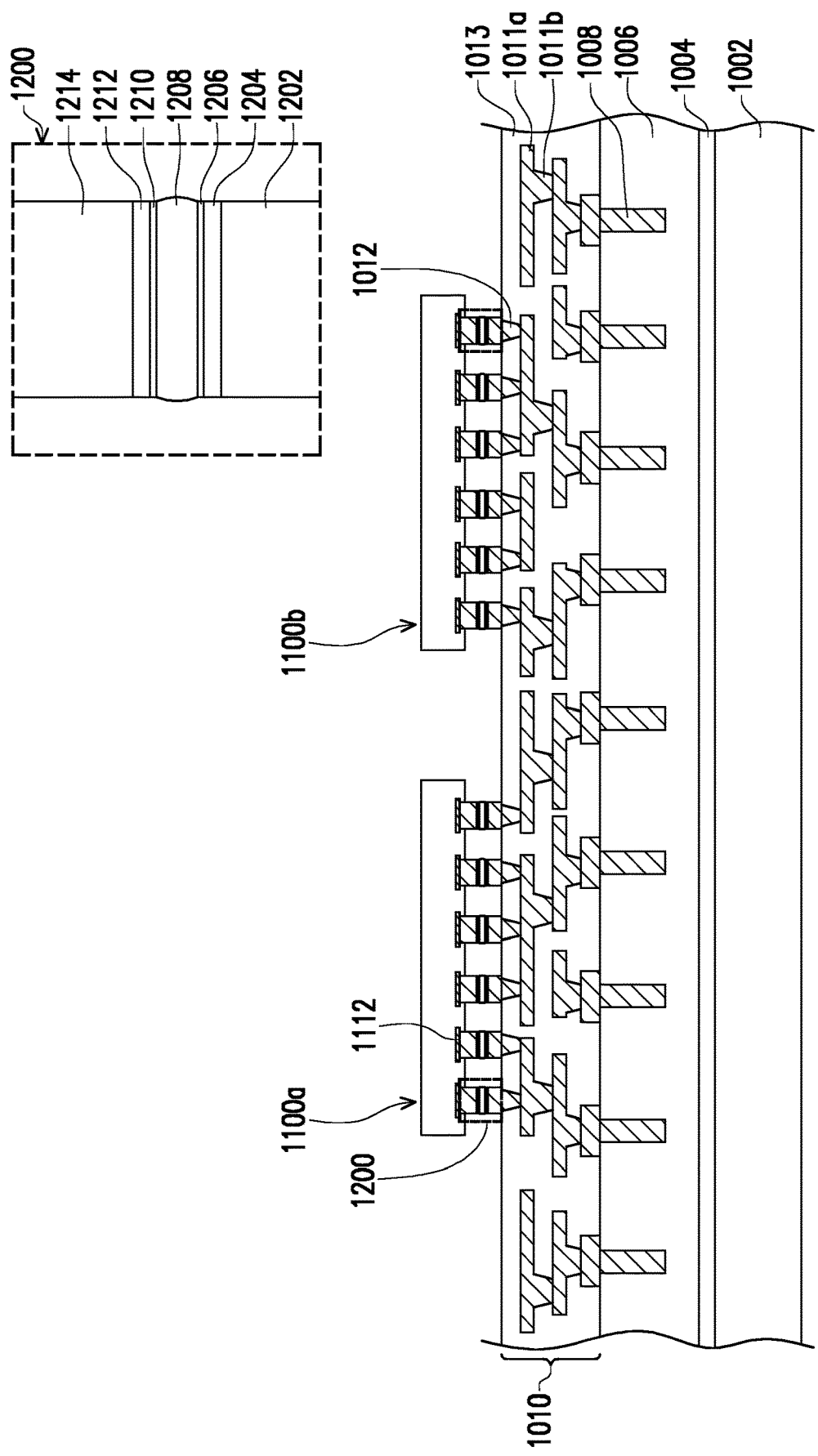
Figure 3D:
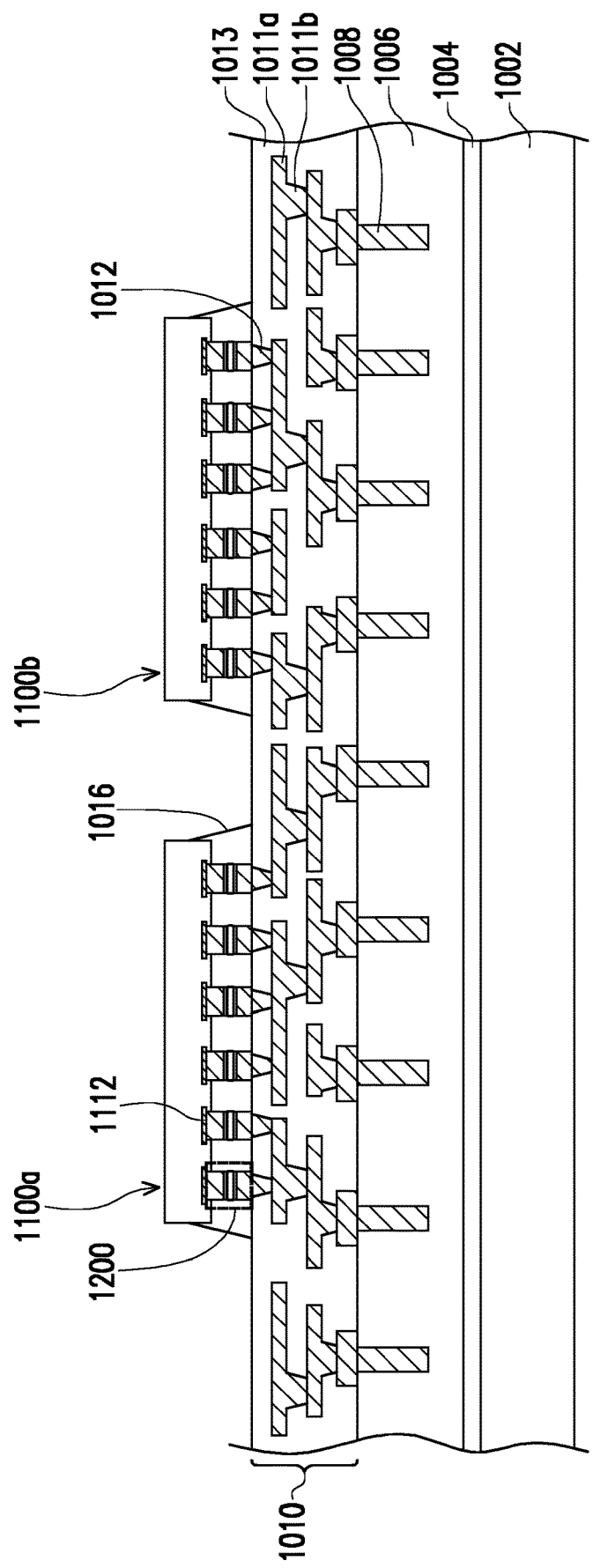
Figure 3E:
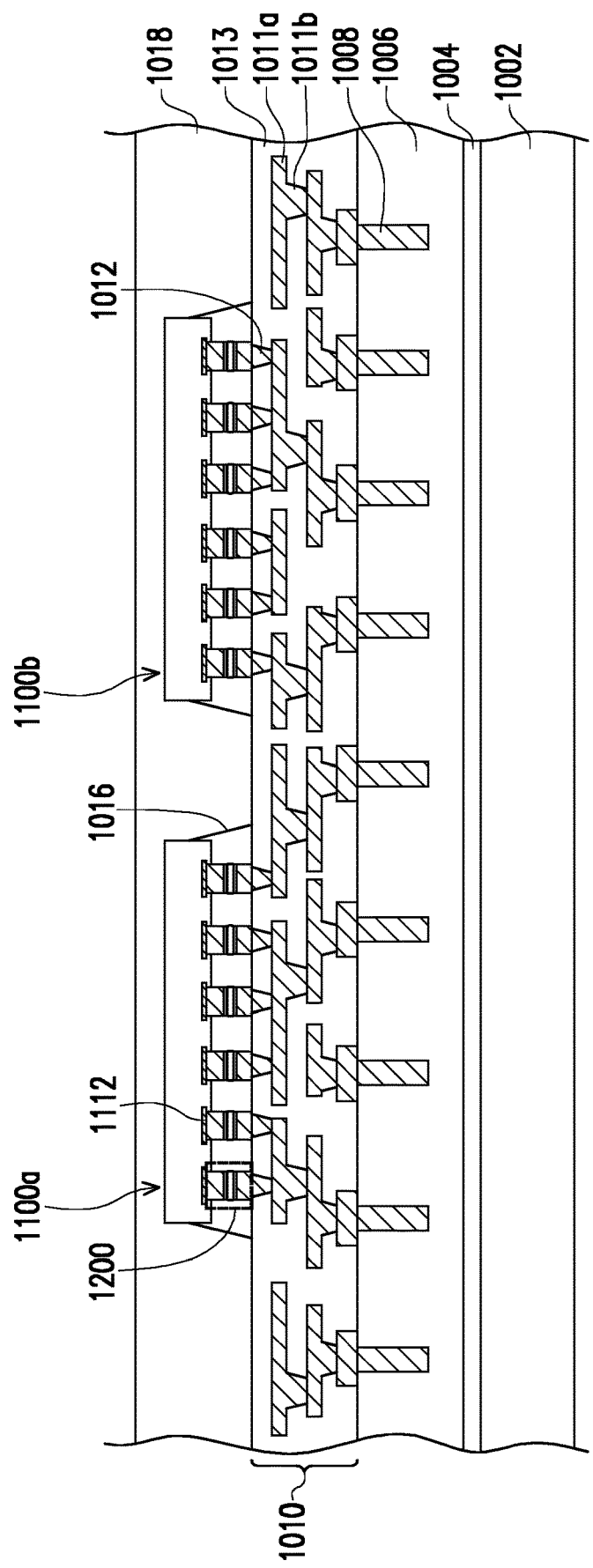
Figure 3F:
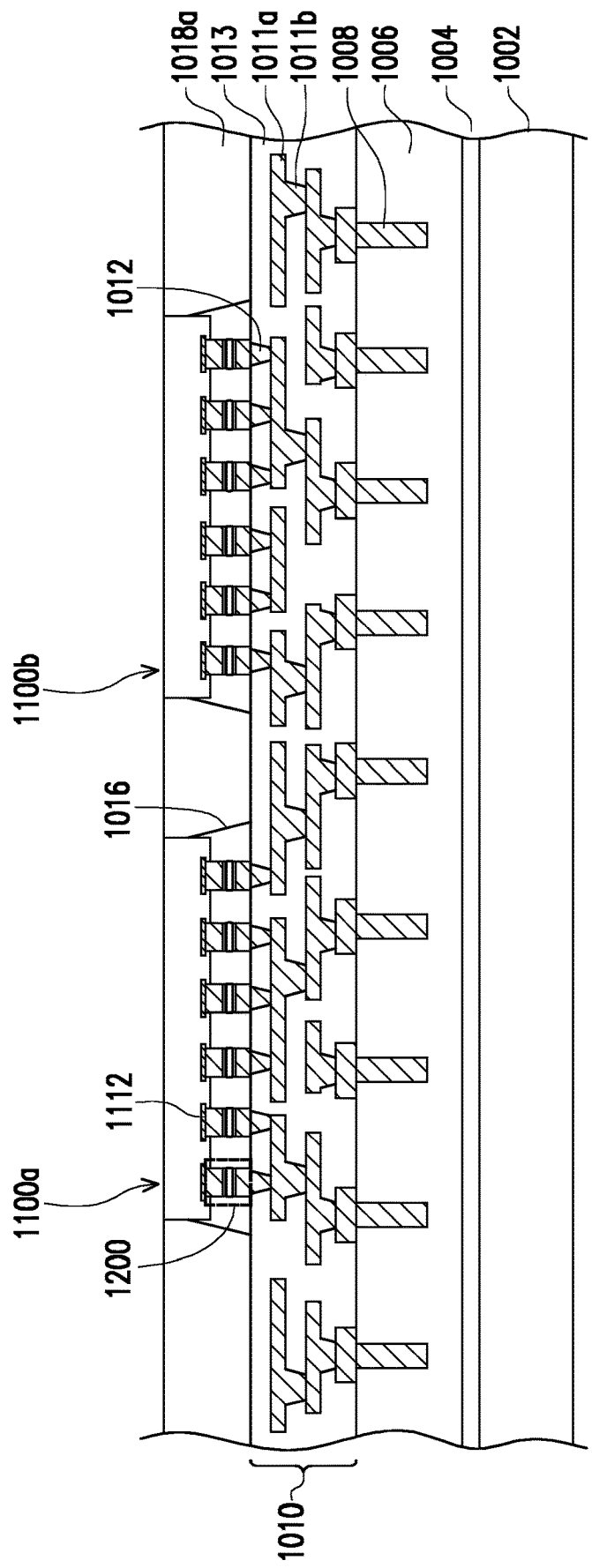
Figure 3G:
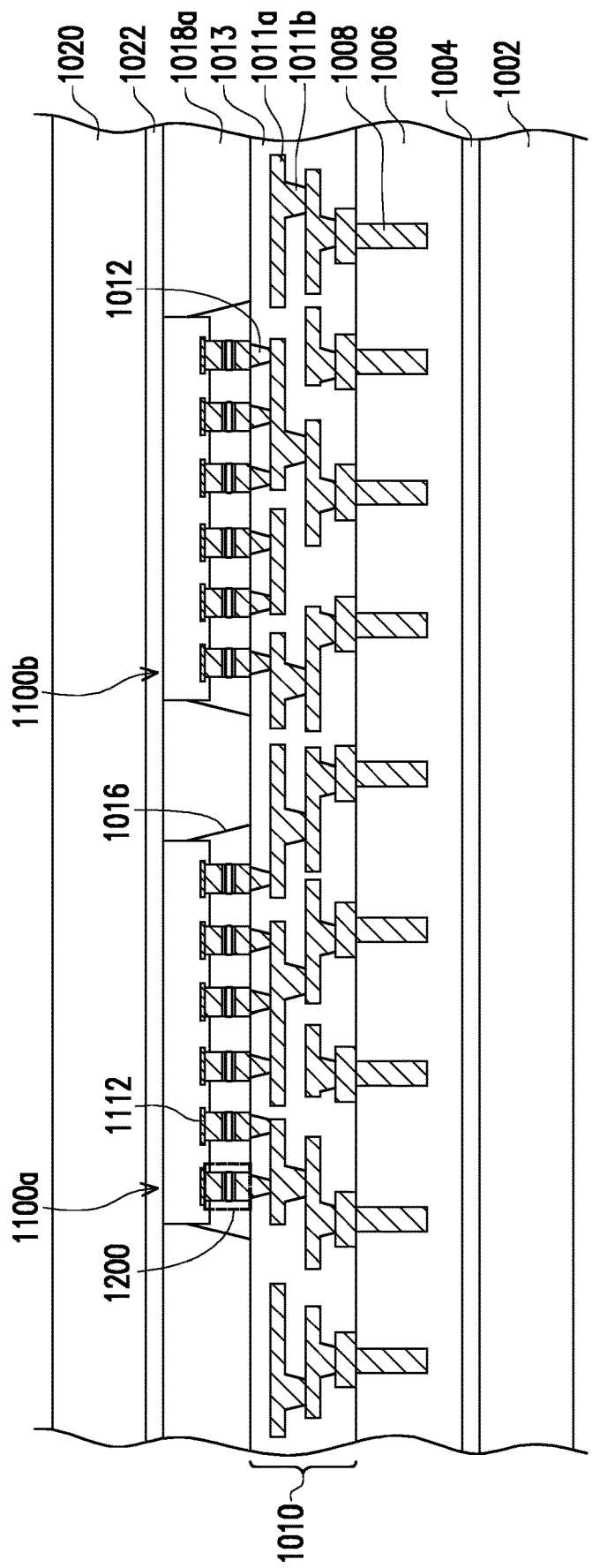
Figure 3H:
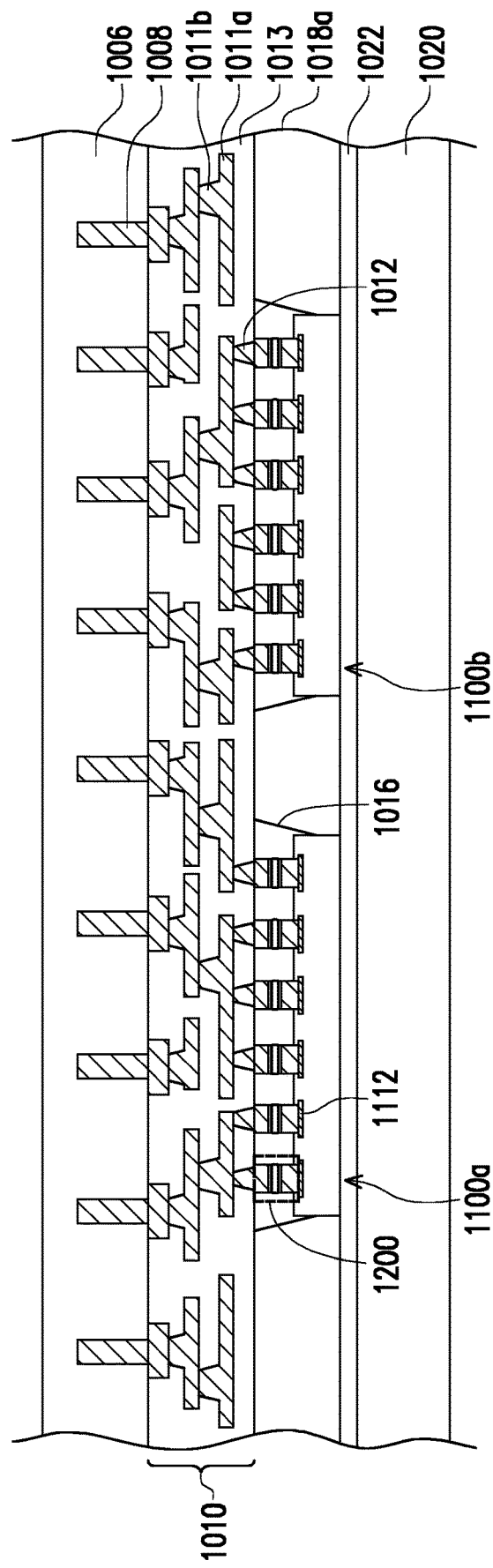
Figure 3I:
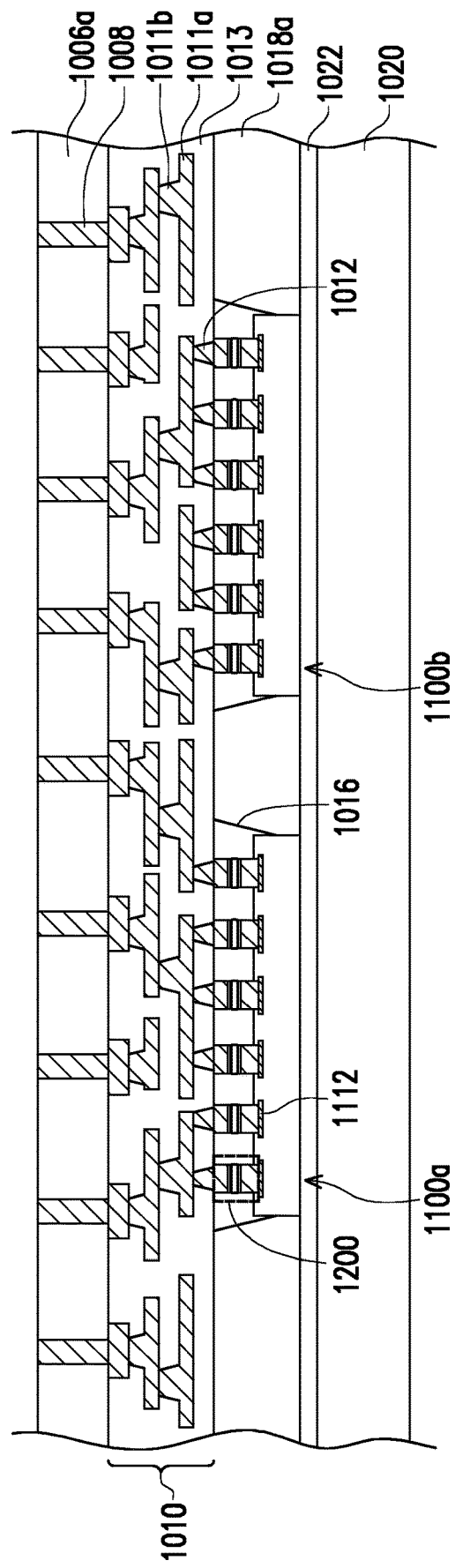
Figure 3J:
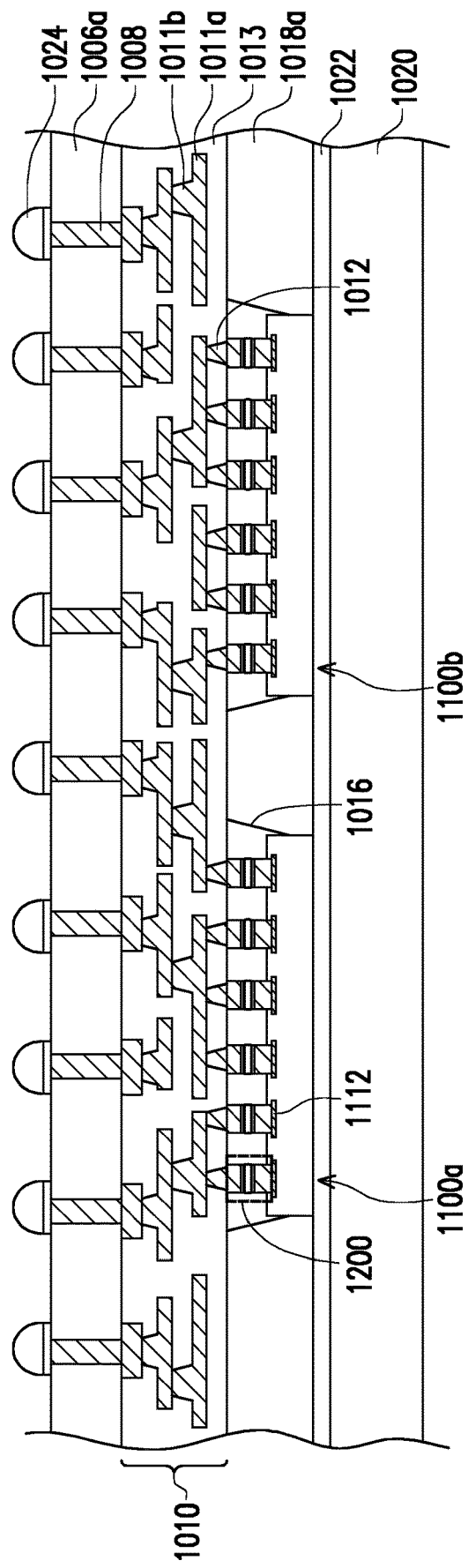
Figure 3K:
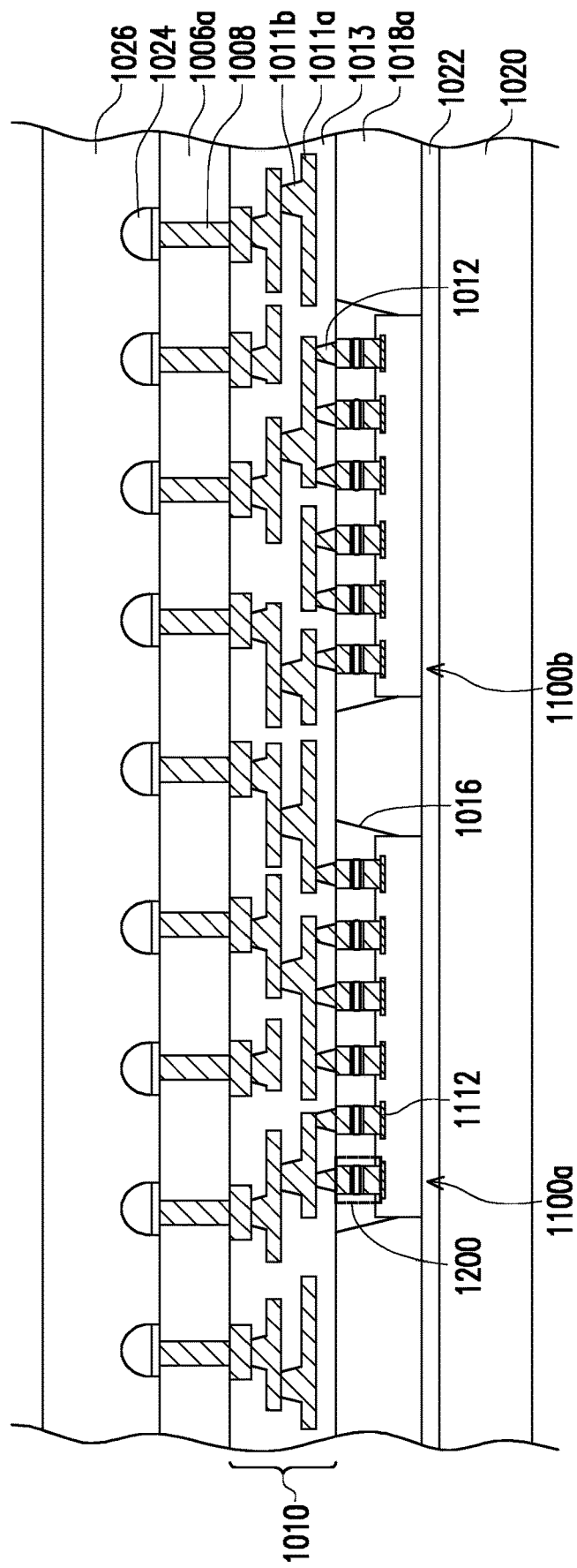
Figure 3L:
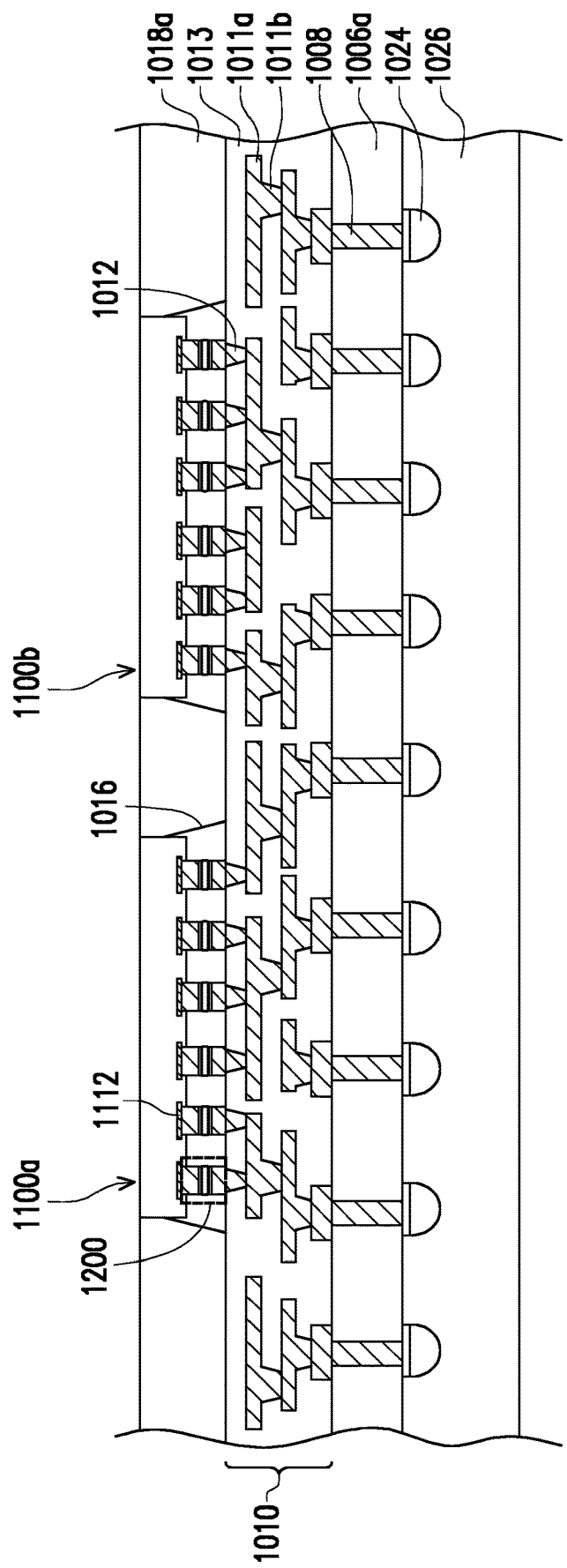
Figure 3M:
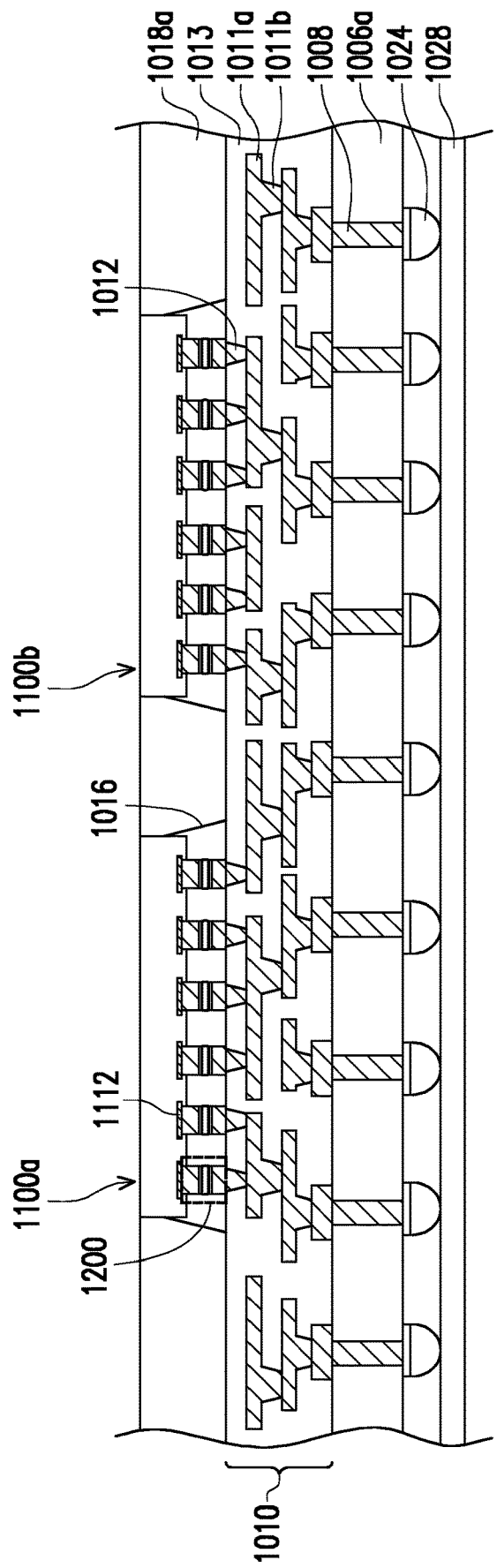
Figure 3N:
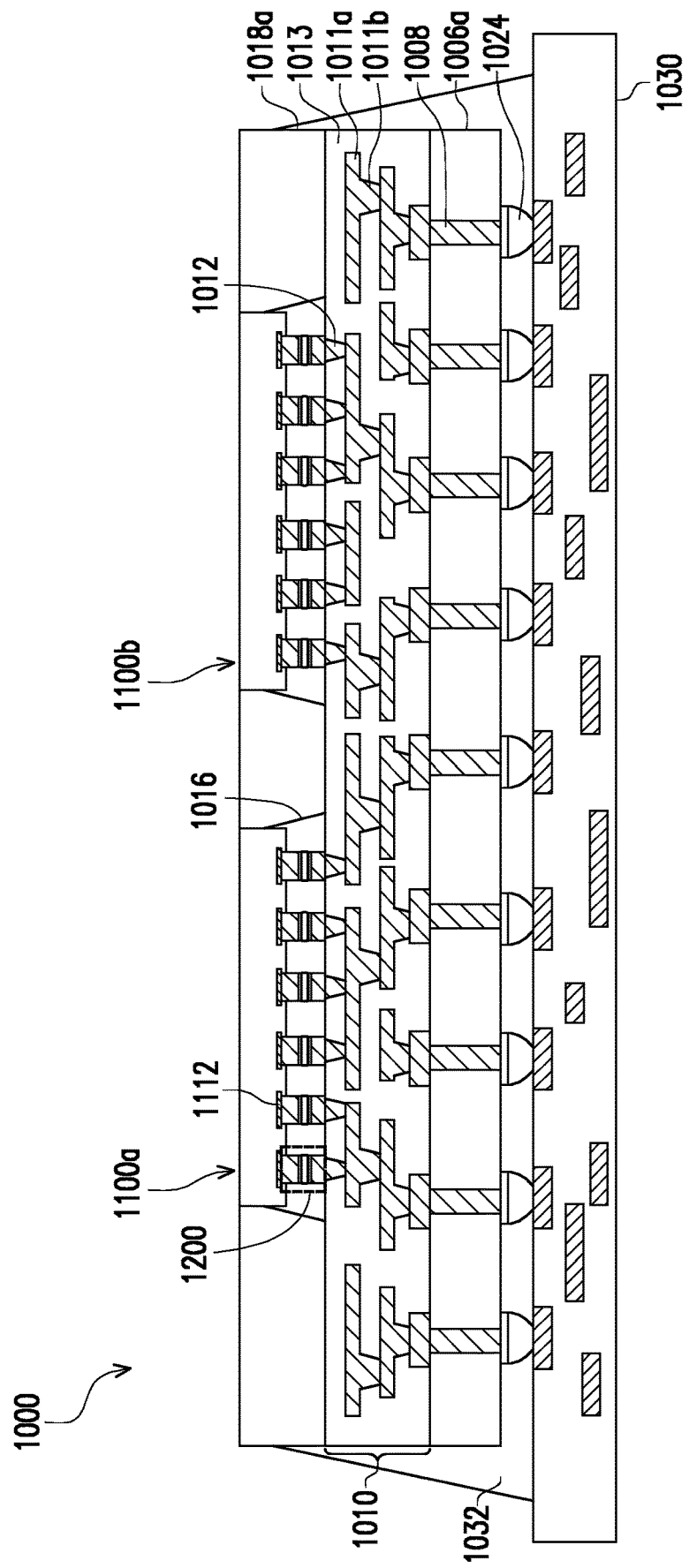

FIG. 3A through FIG. 3N are cross-sectional views schematically illustrating a process flow for fabricating a package structure in accordance with some embodiments of the present disclosure.

Referring to FIG. 3A, in accordance with some embodiments, an interposer 1006 is placed on a carrier 1002. Generally, the carrier 1002 provides temporary mechanical and structural support for various features (e.g., the interposer 1006) during subsequent processing steps and may be a glass carrier, a ceramic carrier or a suitable wafer carrier. In some embodiments, the carrier 1002 may include a release layer 1004 for bonding and debonding the interposer 1006.

The interposer 1006 may be made of a semiconductor material such as silicon, germanium, diamond, or compound materials such as silicon germanium, silicon carbide, gallium arsenic, indium arsenide, indium phosphide, silicon germanium carbide, gallium arsenic phosphide, gallium indium phosphide, or a combination thereof. In some embodiments, the interposer 1006 includes vias 1008 embedded therein, and the vias 1008 may be formed of metallic materials including copper, titanium, cobalt, tungsten, aluminum, or alloys thereof. In some embodiments, a redistribution layer (RDL) structure 1010 is formed on the interposer 1006. The RDL structure 1010 includes routing portions 1011a and via portions 1011b embedded in a dielectric portion 1013 and uppermost contacts 1012 exposed from the dielectric portion 1013. The RDL structure 1010 may be formed using any suitable processes. In some embodiments, the routing portions 1011a, the via portions 1011b interconnecting the routing portions 1011a and the contacts 1012 are made of a metallic material such as copper, titanium, cobalt, tungsten, aluminum, or alloys thereof. In some embodiments, the dielectric portion 1011c is formed of a polymer material, such as polybenzoxazole (PBO), polyimide, benzocyclobutene (BCB), or the like. In some embodiments, the contacts 1012 are electrically connected to the routing portions 1011a and the via portions 1011b.

Connecting structures 1014 are then formed on the contacts 1012 of the RDL structure 1010. In some embodiments, one of the connecting structures 1014 is disposed on one of the contacts 1012, in a one-to-one fashion. In some embodiments, the connecting structures 1014 may be formed following the processes illustrated in FIGS. 1A to 1G. In some embodiments, the connecting structures 1014 may be similar to the connecting structures 100, 200, 300 or 400 as described in the previous embodiments.

Referring to FIG. 3B, semiconductor dies 1100a and 1100b each having a plurality of conductive sites 1112 and a plurality of connectors 1114 are provided and disposed over the RDL structure 1010. In some embodiments, the die 1100a and the die 1100b are different types of dies or may have different structures and functions. In some embodiments, the die 1100a may include or be a logic die, and the die 1100b may include or be a memory die. For example, the logic die may include a central processing unit (CPU), an application processor (AP), a system on chips (SOCs), an application specific integrated circuit (ASIC), or other types of logic transistors therein. For example, the memory die may be a dynamic random access memory (DRAM) die, a static random access memory (SRAM) die, a high-bandwidth memory (HBM) die, a micro-electro-mechanical system (MEMS) die, a hybrid memory cube (HMC) die, or the like. Although only one die 1100a and one die 1100b are shown in the drawings, more than one die 1100a and more than one die 1100b may be provided. In some embodiments, the dies 1100a and 1100b may have identical structures and/or identical functions. For the dies 1100a and 1100b, one of the connectors 1114 is disposed on one of the connecting structures 1014 in a one-to-one fashion. In some embodiments, the connectors 1114 may have similar structures as the connecting structures 100, 200, 300 or 400 as described in the previous embodiments. For example, both of the connecting structures 1014 and the connectors 1114 may have similar structures as the connecting structures 100, 200, 300 or 400 as described in the previous embodiments. Alternatively, the connecting structures 1014 may have similar structures as the connecting structures 100, 200, 300 or 400, while the connectors 1114 are made of metal pillars such as copper pillars (not shown). Alternatively, the connecting structures 1014 are made of metal pillars such as copper pillars, while the connectors 1114 have similar structures as the connecting structures 100, 200, 300 or 400 as described in the previous embodiments.

Referring to FIG. 3C, a thermal process is performed to bond the dies 1100a and 1100b to the RDL structure 1010 and connected structures 1200 are formed between the contacts 1012 of the RDL structure 1010 and the conductive sites 1112 of the dies 1100a and 1100b. That is, the dies 1100a and 1100b are respectively bonded to and electrically connected to the RDL structure 1010 through the connected structures 1200. In one embodiment, as seen in the enlarged partial view of the connected structure 1200 on the upper right part of the FIG. 3C, each of the connected structures 1200 includes a first metallic layer 1202 disposed on one of the contacts 1012, a first intermetallic compound layer 1204 disposed on the first metallic layer 1202, a second intermetallic compound layer 1206 disposed on the first intermetallic compound layer 1204, a second metallic layer 1208 disposed on the second intermetallic compound layer 1206, a third intermetallic compound layer 1210 disposed on the second metallic layer 1208, a fourth intermetallic compound layer 1212 disposed on the third intermetallic compound layer 1210 and a third metallic layer 1214 disposed on the fourth intermetallic compound layer 1212. The first metallic layer 1202 and the third metallic layer 1214 may include copper or copper alloys. The first intermetallic compound layer 1204 and the fourth intermetallic compound layer 1212 may include the first intermetallic compound. In some embodiments, the first intermetallic compound includes a Cu—Ni—Sn intermetallic compound. The second intermetallic compound layer 1206 and the third intermetallic compound layer 1210 may include the second intermetallic compound different from the first intermetallic compound. In some embodiments, the second intermetallic compound includes a Cu—Ni—Sn intermetallic compound different from the Cu—Ni—Sn intermetallic compound included in the first intermetallic compound layer 1204 and the fourth intermetallic compound layer 1212. The second metallic layer 1208 may include tin or SnCu. In some embodiment, when both of the connecting structures 1014 and the connectors 1114 have similar structures as the connecting structures 100, 200, 300 or 400 as described in the previous embodiments, the connected structures 1200 have a symmetric structure.

Referring to FIGS. 3D and 3E, an underfill 1016 may be formed between the dies 1100a/1100b and the RDL structure 1010 and may surround the connected structures 1200. The underfill 1016 may be formed by a capillary flow process after the dies 1100a and 1100b are attached, or may be formed by a suitable deposition method before the dies 1100a and 1100b are attached. Next, an encapsulant material layer 1018 is formed to cover the dies 1100a and 1100b. In some embodiments, a material of the encapsulant material layer 1018 includes a molding compound. The molding compound may include a resin (e.g., epoxy resin) and a filler contained in the resin. In some alternatively embodiments, a material of the encapsulant material layer 1018 includes an oxide or a nitride, such as silicon oxide, silicon nitride or a combination thereof. The encapsulant material layer 1018 may be formed by spin-coating, lamination, deposition or the like.

Referring to FIG. 3F, a planarization process such as a chemical mechanical polishing (CMP) process, a mechanical grinding process, a combination thereof or other applicable planarization processes is then performed to obtain an insulating encapsulation 1018a. The insulating encapsulation 1018a is formed around the dies 1100a and 1100b to encapsulate the dies 1100a and 1100b. In addition, top surfaces of dies 1100a and 1100b are revealed.

Referring to FIG. 3G, a substrate 1020 is attached to the revealed surfaces of the dies 1100a and 1100b through an adhesive layer 1022. In some embodiments, the adhesive layer 1022 may comprise a die attach film (DAF). In some embodiments, the substrate 1020 may be formed of silicon. For example, the substrate 1020 may be formed of substantially pure silicon. In other embodiments, the substrate 1020 may comprise any suitable material that provides rigidity and/or thermal conductance, such that the substrate 1020 may help to evenly distribute heat and provide structural support to the top surfaces of the dies 1100a and 1100b during additional processing. In some embodiments, the substrate 1020 may comprise a metal, such as copper (Cu), nickel (Ni), or aluminum (Al). In some embodiments, the substrate 1020 may comprise a ceramic material such as aluminum oxide ($Al_2O_3$). In some embodiments, the substrate 1020 may comprise a polymer material.

Referring to FIG. 3H, the structure shown in FIG. 3G is flipped so that the substrate 1020 is on the bottom and provides physical support for the structure shown in FIG. 3G. The carrier 1002 is then debonded, leaving the structure shown in FIG. 3H.

Referring to FIGS. 3I and 3J, a planarization process such as a chemical mechanical polishing (CMP) process, a mechanical grinding process, a combination thereof or other applicable planarization processes is then performed to obtain an interposer 1006a, and the vias 1008 are revealed. The connectors 1024 are then formed on the interposer 1006a. Each of the connectors 1024 is electrically connected to one of the vias 1008. The connectors 1024 may be bumps, solder balls, metal pillars, controlled collapse chip connection (C4) bumps, micro bumps, electroless nickel-electroless palladium-immersion gold technique (ENEPIG) formed bumps, a combination thereof (e.g., a metal pillar having a solder ball attached thereof), or the like. The connectors 1024 may include a conductive material such as solder, copper, aluminum, gold, nickel, silver, palladium, tin, the like, or a combination thereof. In some embodiments, the connectors 1024 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and tin-silver-copper (SAC) compositions; and other eutectic materials that have a common melting point and form conductive solder connections in electrical applications. For lead-free solders, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 1024 may form a grid, such as a ball grid array (BGA). In some embodiments, a reflow process may be performed, giving the connectors 1024 a shape of a partial sphere in some embodiments. Alternatively, the connectors 1024 may comprise other shapes.

The connectors 1024 may also comprise non-spherical conductive connectors. In some embodiments, the connectors 1024 comprise metal pillars (such as a copper pillar) formed by sputtering, printing, electro plating, electroless plating, CVD, or the like, with or without a solder material thereon. The metal pillars may be solder free and have substantially vertical sidewalls or tapered sidewalls. The connectors 1024 may also include an under-bump metallization (UBM) formed and patterned over an uppermost metallization pattern in accordance with some embodiments, thereby forming an electrical connection with an uppermost metallization layer. The UBMs provides an electrical connection upon which an electrical connector, e.g., a solder ball/bump, a conductive pillar, or the like, may be placed. In an embodiment, the UBMs include a diffusion barrier layer, a seed layer, or a combination thereof. The diffusion barrier layer may include Ti, TiN, Ta, TaN, or a combination thereof. The seed layer may include copper or copper alloys. However, other metals, such as nickel, palladium, silver, gold, aluminum, a combination thereof, and multi-layers thereof, may also be included. In an embodiment, UBMs are formed using sputtering. In other embodiments, electro plating may be used.

Referring to FIG. 3K, a protection film 1026 is applied over the interposer 1006a. The protection film 1026 has a sufficient thickness to fully cover the connectors 1024. The protection film 1026 may be a tape, such as a back grinding (BG) tape (UV or non-UV type), which may be used to protect the surface of the interposer 1006a and the connectors 1024 from grinding debris during a subsequent planarization process. The protective film 1026 may be applied using, for example, a roller (not shown).

Referring to FIGS. 3L and 3M, the structure shown in FIG. 3K is flipped again so that the protective film 1026 is on the bottom and provides physical support to the structure shown in FIG. 3K. The substrate 1020 and the adhesive layer 1022 are then removed by a suitable process from the dies 110a/1100b and the insulating encapsulation 1018a. A planarization process such as a chemical mechanical polishing (CMP) process, a mechanical grinding process, a combination thereof or other applicable planarization processes is then performed so that the dies 110a/1100b and the insulating encapsulation 1018a are thinned. The protection film 1026 is then removed, and the structure illustrated in FIG. 3L with the protection film 1026 removed is mounted on a frame structure 1028 for further processing. For example, a cleaning process may be performed to remove impurities or residues derived from the previous process steps.

Referring to FIG. 3N, the frame structure 1028 is removed and a singulation process is performed. In some embodiments, the singulation process typically involves dicing with a rotating blade or a laser beam. In other words, the singulation process is, for example, a laser cutting process, a mechanical cutting process, or other suitable processes. Thereafter, the singulated structure is placed on a substrate 1030 to obtain a package structure 1000. In some embodiments, the substrate 1030 may include a printed circuit board (PCB) or the like. In some embodiments, an underfill layer 1032 may be optionally formed on the substrate 1030 to protect the connectors 1024. In some embodiments, the package structure 1000 illustrated in FIG. 3N may be referred to as a "CoWoS (Chip on Wafer on Substrate) package." However, the disclosure is not limited thereto. In some alternative embodiments, the process steps illustrated in FIG. 3A to FIG. 3N may be adapted to fabricate other type of packages, such as integrated fan-out (InFO) packages or the like.

FIG. 4A through FIG. 4G are schematic cross-sectional views illustrating various connected structures in accordance with embodiments of the present disclosure.

Figure 4A:
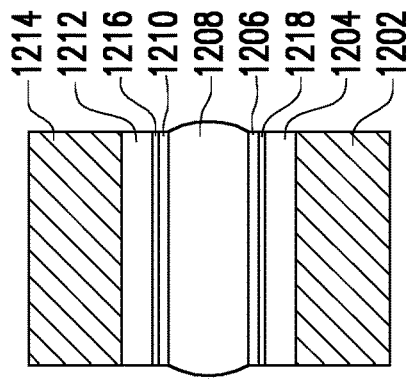
FIG. 4A through FIG. 4G are schematic cross-sectional views illustrating various connected structures in accordance with embodiments of the present disclosure.
Figure 4B:
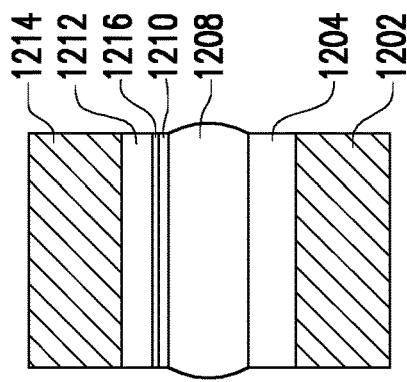

Referring to FIGS. 4A and 4B, in one embodiment, the connecting structures 1014 may be metal pillars such as copper pillars, and the connectors 1114 may be formed by the process illustrated in FIGS. 1A to 1G. In such an embodiment, each of the connected structures includes a first metallic layer 1202 disposed on one of the contacts 1012, a first intermetallic compound layer 1204 disposed on the first metallic layer 1202, a second metallic layer 1208 disposed on the first intermetallic compound layer 1204, a third intermetallic compound layer 1210 disposed on the second metallic layer 1208, a fourth intermetallic compound layer 1212 disposed on the third intermetallic compound layer 1210 and a third metallic layer 1214 disposed on the fourth intermetallic compound layer 1212 as shown in FIG. 4A. That is, in such an embodiment, each of the connected structures does not include the second intermetallic compound layer 1206. In one alternative embodiment, each of the connected structures may further include a fourth metallic layer 1216 between the third intermetallic compound layer 1210 and the fourth intermetallic compound layer 1212 as shown in FIG. 4B. The fourth metallic layer 1216 comprise nickel, cobalt or alloys thereof.

Figure 4C:
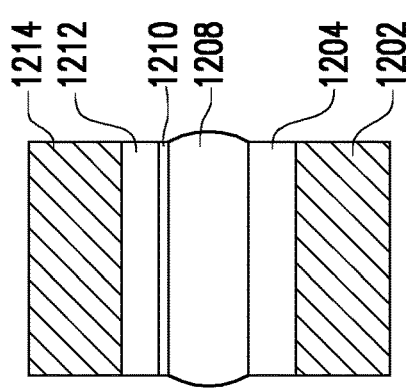
Figure 4D:
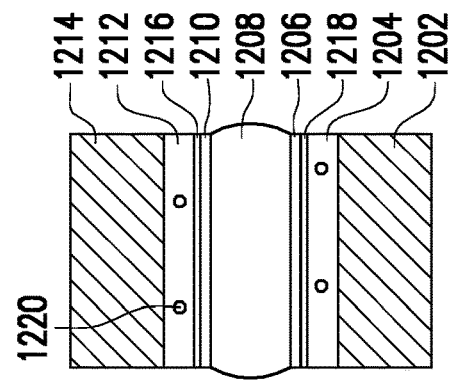
Figure 4E:
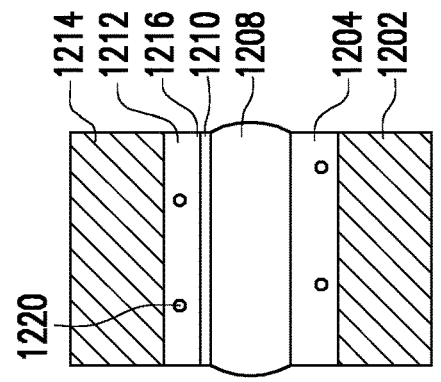
Figure 4F:
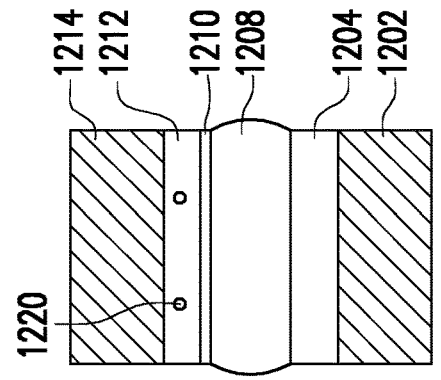
Figure 4G:
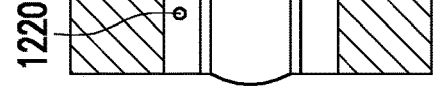

Referring to FIG. 4C, in one embodiment, in addition to the first metallic layer 1202, the first intermetallic compound layer 1204, the second intermetallic compound layer 1206, the second metallic layer 1208, the third intermetallic compound layer 1210, the fourth intermetallic compound layer 1212 and the third metallic layer 1214, each of the connected structures further includes a fourth metallic layer 1216 disposed between the third intermetallic compound layer 1210 and the fourth intermetallic compound layer 1212 and a fifth metallic layer 1218 disposed between the first intermetallic compound layer 1204 and the second intermetallic compound layer 1206. The fourth metallic layer 1216 and the fifth metallic layer 1218 comprise nickel, cobalt or alloys thereof.

Referring to FIG. 4D to FIG. 4G, in one embodiment, the second metallic layer 1208 comprises silver in addition to tin. In such an embodiment, the first intermetallic compound layer 1204 and the fourth intermetallic compound layer 1212 further comprises silver compound particles 1220 dispersed therein. In detail, the connected structure shown in FIG. 4D has a similar structure as the connected structure 1200 shown in FIG. 3C, except that silver compound particles 1220 are dispersed in the first intermetallic compound layer 1204 and the fourth intermetallic compound layer 1212. In one alternative embodiment, the connected structure shown in FIG. 4E has a similar structure as the connected structure shown in FIG. 4A, except that silver compound particles 1220 are dispersed in the first intermetallic compound layer 1204 and the fourth intermetallic compound layer 1212. In one alternative embodiment, the connected structure shown in FIG. 4F has a similar structure as the connected structure shown in FIG. 4B, except that silver compound particles 1220 are dispersed in the first intermetallic compound layer 1204 and the fourth intermetallic compound layer 1212. In one alternative embodiment, the connected structure shown in FIG. 4G has a similar structure as the connected structure shown in FIG. 4C, except that silver compound particles 1220 are dispersed in the first intermetallic compound layer 1204 and the fourth intermetallic compound layer 1212.

In some embodiments, by using the connecting structure with a sufficient amount of solder material, the connected structure(s) is formed with strong bonding and cold joints or joint voids are minimized. Furthermore, the presence of the stable ternary intermetallic compounds such as Cu—Ni—Sn intermetallic compounds also enhances the bonding strength and improves the bonding reliability of the connected structure(s).

In accordance with some embodiments of the disclosure, a structure including a substrate having a conductive pad and a connecting structure disposed on the conductive pad and electrically connected to the conductive pad is provided. The connecting structure includes a first metallic layer disposed on the conductive pad, a first intermetallic compound layer disposed on the first metallic layer, a second intermetallic compound layer disposed on the first intermetallic compound layer and a second metallic layer disposed on the second intermetallic compound layer. The first metallic layer comprises copper. The first intermetallic compound layer comprises a first intermetallic compound. The second intermetallic compound layer comprises a second intermetallic compound that is different from the first intermetallic compound. The second metallic layer comprises tin. The first intermetallic compound contains copper, tin and one of nickel and cobalt.

In accordance with some embodiments of the disclosure, a package structure including an interconnecting structure having a plurality of first conductive sites on a first surface of the interconnecting structure and a semiconductor element having a plurality of second conductive sites on a first surface of the semiconductor element is provided. The semiconductor element is disposed on the interconnecting structure. The first surface of the semiconductor element faces the first surface of the interconnecting structure, and the semiconductor element is connected to the interconnecting structure by a plurality of connected structures disposed between the interconnecting structure and the semiconductor element. Each of the connected structures includes a first metallic layer disposed on one of the first conductive sites, a first intermetallic compound layer disposed on the first metallic layer, a second metallic layer disposed on the first intermetallic compound layer, a second intermetallic compound layer disposed on the second metallic layer, a third intermetallic compound layer disposed on the second intermetallic compound layer and a third metallic layer disposed on the third intermetallic compound layer and connected to one of the second conductive sites. The first metallic layer comprises copper. The first intermetallic compound layer comprises a first intermetallic compound. The second metallic layer comprises tin. The second intermetallic compound layer comprises a second intermetallic compound different from the first intermetallic compound. The third intermetallic compound layer comprises a third intermetallic compound different from the second intermetallic compound. The third metallic layer comprises copper.

In accordance with some embodiments of the disclosure, a method for forming a connecting structure is provided. The method for forming a connecting structure of includes providing a substrate having a conductive pad on a first surface of the substrate; forming a seed layer covering the conductive pad; forming a mask layer with an opening corresponding to the conductive pad; forming a first metal layer on the seed layer in the opening of the mask layer; forming a second metal layer on the first metal layer; forming a third metal layer on the second metal layer; forming a fourth metal layer on the third metal layer, removing the mask layer and removing the seed layer; and performing a thermal process to form a connecting structure. The first metal layer comprises copper. The second metal layer comprises tin. The third metal layer comprises nickel or cobalt. The fourth metal layer comprises tin. The connecting structure comprises: a first metallic layer disposed on the conductive pad, a first intermetallic compound layer disposed on the first metallic layer, a second intermetallic compound layer disposed on the first intermetallic compound layer and a second metallic layer disposed on the second intermetallic compound layer. The first intermetallic compound layer comprises a first intermetallic compound. The second intermetallic compound layer comprises a second intermetallic compound that is different from the first intermetallic compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a substrate having a conductive pad; and
   a connecting structure disposed on the conductive pad and electrically connected to the conductive pad, wherein the connecting structure comprises:
   a first metallic layer disposed on the conductive pad, and the first metallic layer comprises copper,
   a first intermetallic compound layer disposed on the first metallic layer, and the first intermetallic compound layer comprises a layer of a first intermetallic compound and silver compound particles that are distributed within the layer of the first intermetallic compound and are nonexistent on surfaces of the layer of the first intermetallic compound, the first intermetallic compound contains a Cu—Ni—Sn intermetallic compound represented by $(Cu_xNi_y)_6Sn_5$, wherein $0.2<x<1$, and $0<y<0.8$,
   a second intermetallic compound layer disposed on the first intermetallic compound layer, and the second intermetallic compound layer comprises a second intermetallic compound that is different from the first intermetallic compound; and
   a second metallic layer disposed on the second intermetallic compound layer, the second metallic layer comprises tin and silver,
   wherein the silver compound particles comprise $Ag_3Sn$.

2. The structure according to claim 1, wherein the second intermetallic compound includes a Ni—Sn intermetallic compound or a Cu—Ni—Sn intermetallic compound different from the Cu—Ni—Sn intermetallic compound represented by $(Cu_xNi_y)_6Sn_5$.

3. The structure according to claim 2, wherein the second intermetallic compound is represented by $(Cu_zNi_w)_3Sn_4$, wherein $0<z<0.4$, and $0.6<w<1$.

4. The structure according to claim 1, wherein the connecting structure further comprises a third metallic layer disposed between the first intermetallic compound layer and the second intermetallic compound layer, and the third metallic layer comprises nickel.

5. The structure according to claim 4, wherein the second intermetallic compound includes a Ni—Sn intermetallic compound.

6. The structure according to claim 1, wherein a thickness of the first metallic layer is about 30~50% of a total height of the connecting structure, and a thickness of the second metallic layer is about 20~50% of the total height of the connecting structure.

7. The structure according to claim 1, wherein a particle size of the silver compound particles is in a range of about 30 nm to about 2000 nm.

8. The structure according to claim 1, wherein a content of the silver compound particles in the first intermetallic compound layer is in a range of about 1.5 wt % to 4.5 wt %.

9. A package structure, comprising:
an interconnecting structure having a plurality of first conductive sites on a first surface of the interconnecting structure; and
a semiconductor element having a plurality of second conductive sites on a first surface of the semiconductor element, disposed on the interconnecting structure, wherein the first surface of the semiconductor element faces the first surface of the interconnecting structure, and the semiconductor element is connected to the interconnecting structure by a plurality of connected structures disposed between the interconnecting structure and the semiconductor element,
wherein each of the connected structures comprises:
a first metallic layer disposed on one of the first conductive sites, and the first metallic layer comprises copper,
a first intermetallic compound layer disposed on the first metallic layer, and the first intermetallic compound layer comprises a layer of a first intermetallic compound and silver compound particles that are distributed within the layer of the first intermetallic compound without being presented on surfaces of the layer of the first intermetallic compound, the first intermetallic compound contains a Cu—Ni—Sn intermetallic compound represented by $(Cu_xNi_y)_6Sn_5$, wherein $0.2<x<1$, and $0<y<0.8$,
a second metallic layer disposed on the first intermetallic compound layer, and the second metallic layer comprises tin and silver,
a second intermetallic compound layer disposed on the second metallic layer, and the second intermetallic compound layer comprises a second intermetallic compound different from the first intermetallic compound,
a third intermetallic compound layer disposed on the second intermetallic compound layer, and the third intermetallic compound layer comprises a third intermetallic compound different from the second intermetallic compound, and
a third metallic layer disposed on the third intermetallic compound layer and connected to one of the second conductive sites, and the third metallic layer comprises copper,
wherein the silver compound particles comprise $Ag_3Sn$.

10. The package structure according to claim 9, wherein the third intermetallic compound is the same as the first intermetallic compound.

11. The package structure according to claim 9, wherein each of the connected structures further comprises a fourth intermetallic compound layer disposed between the first intermetallic compound layer and the second metallic layer, and the fourth intermetallic compound layer comprises a fourth intermetallic compound different from the first intermetallic compound and the third intermetallic compound.

12. The package structure according to claim 11, wherein the fourth intermetallic compound is the same as the second intermetallic compound.

13. The package structure according to claim 9, wherein each of the connected structures further comprises a fourth metallic layer disposed between the second intermetallic compound layer and the third intermetallic compound layer, and the fourth metallic layer comprises nickel or cobalt.

14. The package structure according to claim 13, wherein each of the connected structures further comprises a fourth intermetallic compound layer disposed between the first intermetallic compound layer and the second metallic layer, and the fourth intermetallic compound layer comprises a fourth intermetallic compound different from the first intermetallic compound and different from the third intermetallic compound.

15. The package structure according to claim 14, wherein each of the connected structures further comprises a fifth metallic layer disposed between the first intermetallic compound layer and the fourth intermetallic compound layer, and the fifth metallic layer comprises nickel or cobalt.

16. The package structure according to claim 9, wherein a particle size of the silver compound particles is in a range of about 30 nm to about 2000 nm.

17. The package structure according to claim 9, wherein a content of the silver compound particles in the first intermetallic compound layer is in a range of about 1.5 wt % to 4.5 wt %.

18. The package structure according to claim 9, wherein the interconnecting structure includes routing portions and via portions embedded in a polymeric dielectric layer and the plurality of first conductive sites is exposed from the polymeric dielectric layer covering the first surface of the interconnecting structure.

19. A method for forming a connecting structure, comprising:
providing a substrate having a conductive pad on a first surface of the substrate;
forming a seed layer covering the conductive pad;
forming a mask layer with an opening corresponding to the conductive pad;
forming a first metal layer on the seed layer in the opening of the mask layer, wherein the first metal layer comprises copper;
forming a second metal layer on the first metal layer, wherein the second metal layer comprises tin and silver;
forming a third metal layer on the second metal layer, wherein the third metal layer comprises nickel or cobalt;
forming a fourth metal layer on the third metal layer, wherein the fourth metal layer comprises tin;
removing the mask layer and removing the seed layer; and
performing a thermal process to form a connecting structure,
wherein the connecting structure comprises:
a first metallic layer disposed on the conductive pad;
a first intermetallic compound layer disposed on the first metallic layer, and the first intermetallic compound layer is formed of a layer of a first intermetallic compound and silver compound particles that are distributed within the layer of the first intermetallic compound and are nonexistent on surfaces of the layer of the first intermetallic compound, the first intermetallic compound contains a Cu—Ni—Sn intermetallic compound represented by $(Cu_xNi_y)_6Sn_5$, wherein $0.2<x<1$, and $0<y<0.8$;
a second intermetallic compound layer disposed on the first intermetallic compound layer, and the second intermetallic compound layer comprises a second intermetallic compound that is different from the first intermetallic compound; and
a second metallic layer disposed on the second intermetallic compound layer,
wherein the silver compound particles comprise $Ag_3Sn$.

20. The method for forming a connecting structure according to claim 19, wherein a thickness of the first metal layer is larger than a sum of a thickness of the second metal layer and a thickness of the fourth metal layer.

\* \* \* \* \*